(12) United States Patent
Kolics et al.

(10) Patent No.: US 9,048,088 B2
(45) Date of Patent: Jun. 2, 2015

(54) PROCESSES AND SOLUTIONS FOR SUBSTRATE CLEANING AND ELECTROLESS DEPOSITION

(75) Inventors: Artur Kolics, Dublin, CA (US); Nanhai Li, Pleasanton, CA (US)

(73) Assignee: Lam Research Corporation, Fremont, CA (US)

(*) Notice: Subject to any disclaimer, the term of this patent is extended or adjusted under 35 U.S.C. 154(b) by 1044 days.

(21) Appl. No.: 12/407,249

(22) Filed: Mar. 19, 2009

(65) Prior Publication Data
US 2009/0246359 A1 Oct. 1, 2009

Related U.S. Application Data

(60) Provisional application No. 61/040,645, filed on Mar. 28, 2008.

(51) Int. Cl.
- *B05D 5/12* (2006.01)
- *H01L 21/02* (2006.01)
- *H01L 21/768* (2006.01)

(52) U.S. Cl.
CPC ...... *H01L 21/02074* (2013.01); *H01L 21/7684* (2013.01); *H01L 21/76883* (2013.01)

(58) Field of Classification Search
USPC .......... 427/98, 532, 534, 97.8, 98.5, 98.6, 427/97.9, 352
See application file for complete search history.

(56) References Cited

U.S. PATENT DOCUMENTS

| | | | |
|---|---|---|---|
| 3,993,575 A | 11/1976 | Howanitz et al. | |
| 4,182,687 A | 1/1980 | Bartlett | |
| 4,684,550 A | 8/1987 | Milius et al. | |
| 5,167,992 A | 12/1992 | Lin et al. | |
| 5,405,656 A | 4/1995 | Ishikawa et al. | |
| 5,419,821 A | 5/1995 | Vaughan | |
| 5,897,692 A | 4/1999 | Kotsuka et al. | |
| 5,909,742 A | 6/1999 | Ouyang et al. | |
| 6,156,218 A | 12/2000 | Okubo et al. | |
| 6,514,921 B1 | 2/2003 | Kakizawa et al. | |
| 6,696,399 B1 | 2/2004 | Chernin et al. | |
| 6,911,067 B2 | 6/2005 | Kolics et al. | |
| 7,087,104 B2 | 8/2006 | Choi et al. | |
| 7,273,813 B2 | 9/2007 | Emami et al. | |
| 7,285,492 B2 | 10/2007 | Wang et al. | |

(Continued)

FOREIGN PATENT DOCUMENTS

| | | |
|---|---|---|
| JP | 2003/193246 | 7/2003 |
| JP | 2004/300576 | 10/2004 |

(Continued)

*Primary Examiner* — Stella Yi
(74) *Attorney, Agent, or Firm* — Beyer Law Group LLP

(57) ABSTRACT

This invention pertains to fabrication of devices. One embodiment is a method of substrate cleaning and electroless deposition of a cap layer for an integrated circuit. The method is performed on a substrate having a surface comprising a metal and dielectric damascene metallization layer. The method comprises exposing the surface of the substrate to a cleaning solution sufficient to clean the surface of the substrate and exposing the surface of the substrate to an electroless deposition solution sufficient to deposit the cap layer. Other embodiments of the present invention include solutions to clean the substrate and solutions to accomplish electroless deposition.

36 Claims, 19 Drawing Sheets

(56) References Cited

U.S. PATENT DOCUMENTS

| | | |
|---|---|---|
| 2002/0062840 A1* | 5/2002 | Verhaverbeke et al. ....... 134/1.3 |
| 2002/0185658 A1* | 12/2002 | Inoue et al. ................... 257/200 |
| 2003/0089891 A1 | 5/2003 | Andreas |
| 2003/0100186 A1* | 5/2003 | Kurashima et al. ........... 438/689 |
| 2004/0152318 A1 | 8/2004 | Fukushima et al. |
| 2005/0022909 A1 | 2/2005 | Wang et al. |
| 2005/0245080 A1* | 11/2005 | Wang et al. ................... 438/678 |
| 2006/0174912 A1* | 8/2006 | Emami et al. ................. 134/1.3 |
| 2008/0280437 A1 | 11/2008 | Tanaka et al. |

FOREIGN PATENT DOCUMENTS

| | | |
|---|---|---|
| JP | 2007/509235 | 4/2007 |
| JP | 2008/503093 | 1/2008 |
| WO | 03/057943 A2 | 7/2003 |
| WO | 03/065433 A1 | 8/2003 |
| WO | 2005/038085 A2 | 4/2005 |
| WO | WO 2005-038085 | 4/2005 |
| WO | WO 2005/124855 | 12/2005 |
| WO | WO 2008/001698 A1 | 1/2008 |
| WO | 2008/001697 A1 | 3/2008 |
| WO | WO 2009/120727 A3 | 10/2009 |

\* cited by examiner

PROCESSES AND SOLUTIONS FOR SUBSTRATE CLEANING AND ELECTROLESS DEPOSITION

CROSS REFERENCES

This application claims benefit of U.S. Patent Application Ser. No. 61/040,645, titled "PROCESSES AND SOLUTIONS FOR SUBSTRATE CLEANING AND ELECTROLESS DEPOSITION" to Artur KOLICS and Nanhai Li, filed Mar. 28, 2008. U.S. Patent Application Ser. No. 61/040,645, filed Mar. 28, 2008, is incorporated herein, in its entirety, by this reference.

BACKGROUND

This invention pertains to fabrication of electronic devices such as integrated circuits; more specifically, this invention relates to methods and formulations for cleaning substrates prior to electroless deposition of cap layers on metal and dielectric damascene metallization structures.

The cleaning process for patterned substrates prior to electroless deposition of cap layers on metal interconnects such as copper interconnects is crucial for electroless plating processes. A clean substrate surface is needed to ensure good deposition selectivity, low defect counts, and low etching of the metal interconnect. Using copper technology as an example, the surface of the patterned substrates includes copper interconnect structures embedded in a dielectric, i.e., damascene or dual damascene structures, formed in part by chemical mechanical planarization (CMP). The cap layer is deposited on the copper after CMP. Examples of materials for the cap layer are materials such as cobalt, cobalt alloy, cobalt tungsten, cobalt-nickel alloy, nickel, and nickel alloy. There are many post-CMP cleaning solutions used for cleaning patterned substrates prior to electroless deposition of the cap layer. However, the goals of post-CMP cleaning and the goals of cleaning for electroless deposition of the cap layer are not the same. Consequently, post-CMP cleaning solutions may not produce the type of clean surface needed for electroless deposition of high-quality cap layers. For instance, many of the standard technology cleaning solutions remove only the outer oxide (cupric oxide) film from the copper surface while leaving the inner, mostly cuprous oxide, intact on the surface to passivate the copper. Another common approach attempts to minimize copper etching by including copper corrosion inhibitors in the post-CMP clean solution. Some of the corrosion inhibitors or the copper oxide, if left on the surface before electroless plating, can create significant problems for the electroless deposition process such as causing no or spotty plating on the copper, formation of pinholes/pits in the cap layer, poor adhesion between the substrate and the cap layer, or extra cap layer deposition on the dielectric.

There is a need for improved processes and solutions for depositing cap layers on substrates used to fabricate devices such as electronic devices. More specifically, there is a need for improved cleaning solutions and methods of cleaning substrates that can produce contamination and defect free substrate surfaces for electroless deposition of cap layers that can be used to meet the performance and manufacturing requirements for such devices.

SUMMARY

This invention pertains to fabrication of electronic devices. One embodiment of the present invention is a method of substrate cleaning and electroless deposition of a cap layer for an integrated circuit. The method is performed on a substrate having a surface comprising a metal and dielectric damascene metallization layer. The method comprises exposing the surface of the substrate to a cleaning solution sufficient to clean the surface of the substrate; and substantially without dewetting or drying the surface of the substrate, exposing the surface of the substrate to an electroless deposition solution sufficient to deposit the cap layer. Other embodiments of the present invention include solutions to clean the substrate and solutions to accomplish electroless deposition.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

DESCRIPTION

Figure 1:
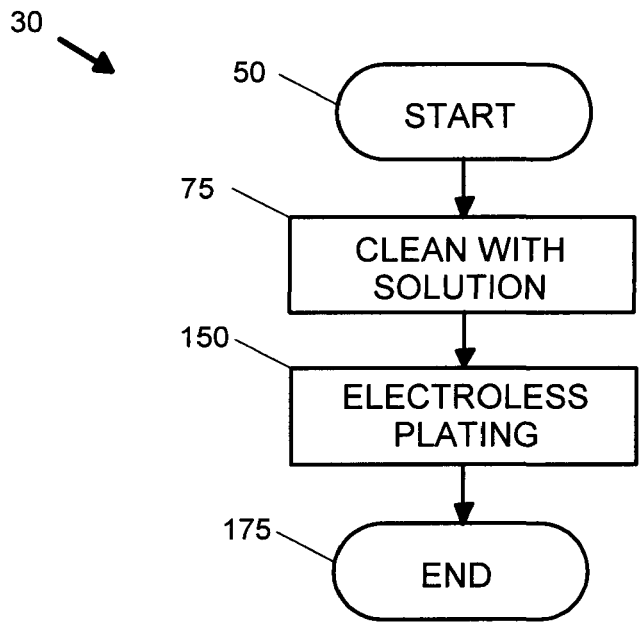
FIG. 1 is a process flow diagram of an embodiment of the present invention.

The present invention pertains to interconnect metallization that uses an electrically conductive metal with a cap and a dielectric forming a damascene metallization structure for devices such as integrated circuits. More particularly, the present invention pertains to interconnect metallization layers that include a dielectric and a metal, such as copper. The fabrication of the devices requires methods and solutions to clean substrates and methods and solutions to accomplish electroless deposition of the cap layer on the substrates.

To overcome one or more problems of the standard technology, some embodiments of the present invention include either a two-step cleaning process or a one-step acidic cleaning process. In order to minimize the copper etching, some embodiments of the present invention include or use electroless-deposition compatible corrosion inhibitors and/or an inert environment during the cleaning process.

For some applications of embodiments of the present invention, the cleaning and the electroless deposition are done in the same process chamber. The cleaning process or at least the second clean of a two-step cleaning process is preferably done with a cleaning solution that includes one or more additive(s) present in the electroless deposition solution. This is preferred if the second cleaning solution is not rinsed off from the substrate surface before the electroless deposition.

Embodiments of the present invention will be discussed below, primarily in the context of processing semiconductor wafers such as silicon wafers used for fabricating integrated circuits. The metallization layers for the integrated circuits include copper for metal lines formed into damascene or dual damascene dielectric structures. Optionally, the dielectric is a dielectric such as silicon dioxide or a low k dielectric material such as a carbon doped silicon oxide (SiOC:H). However, it is to be understood that embodiments in accordance with the present invention may be used for other semiconductor devices, metals other than copper, and wafers other than semiconductor wafers.

One aspect of the present invention includes solutions for processing substrates such as semiconductor wafers. According to one embodiment of the present invention, the solutions are cleaning solutions for cleaning the surface of the substrates in preparation for deposition of a cap layer on the substrate. Solutions according to embodiments of the present invention have compositions so as to be sufficient to clean the surface of the substrate. The deposition of the cap layer is accomplished with an electroless deposition solution sufficient to deposit the cap layer on the substrate. Preferably, at least the final portion of cleaning the surface of the substrate is accomplished using a cleaning solution composition wherein the cleaning solution only comprises components that substantially do not obstruct the operation or performance of the electroless deposition solution if present therein. More specifically, the cleaning solution for at least the final portion of cleaning the surface of the substrate is sufficient to clean the substrate without including components that could poison, degrade, decrease selectivity, or otherwise hinder the operation of the electroless deposition solution for the deposition of the cap layer. Preferably, the cleaning solution composition is selected so that one or more components of the cleaning solution are also components intentionally included in the electroless deposition solution for the cap layer.

In the following description of the figures, identical reference numerals have been used when designating substantially identical elements or steps that are common to the figures. Also for the present description and claims, the word "or" is used as a non-exclusive relation having substantially the same meaning as "and/or," unless specified otherwise.

Solution Compositions

One embodiment of the present invention includes a cleaning solution, (a), comprising an aqueous solution of one or more hydroxycarboxylic acid(s) or one or more non-alkali metal salt(s) of one or more hydroxycarboxylic acid(s). This means that the cleaning solution may have any of or more compositions such as a hydroxycarboxylic acid; more than one hydroxycarboxylic acid; a non-alkali metal salt of a hydroxycarboxylic acid; more than one non-alkali metal salt of a hydroxycarboxylic acid; a hydroxycarboxylic acid mixed with a non-alkali metal salt of a hydroxycarboxylic acid; one or more hydroxycarboxylic acid(s) mixed with one or more non-alkali metal salt(s) of one or more hydroxycarboxylic acid(s). For preferred embodiments, the components of the cleaning solution are selected so that the cleaning of the substrate and the electroless deposition on the substrate are done without drying or dewetting the substrate.

An embodiment of the present invention includes a cleaning solution, (b), comprising an aqueous solution of one or more hydroxycarboxylic acid(s) or one or more non-alkali metal salt(s) of one or more hydroxycarboxylic acid(s); one or more surfactant(s); one or more reducing agent(s); and optionally, one or more pH adjustor(s). The pH of the cleaning solution is >0.5 and <2.5.

Another embodiment of the present invention includes a cleaning solution, (c), comprising an aqueous solution of one or more hydroxycarboxylic acid(s) or one or more non-alkali metal salt(s) of one or more hydroxycarboxylic acid(s); one or more surfactant(s); one or more reducing agent(s); optionally, one or more pH adjustor(s); and optionally, one or more complexing agent(s) for Cu(I) ions. The pH of the cleaning solution is >2.5 and <5.

Another embodiment of the present invention includes a cleaning solution, (d), comprising an aqueous solution of one or more hydroxycarboxylic acid(s) or one or more non-alkali metal salt(s) of one or more hydroxycarboxylic acid(s); one or more surfactant(s); one or more reducing agent(s); optionally, one or more pH adjustor(s); optionally, one or more complexing agent(s) for Cu(I) ions; optionally, one or more corrosion inhibitor(s) substantially free of nitrogen and substantially free of sulfur; and optionally, one or more oxygen scavenger(s). The pH of the cleaning solution is >5 and <8.

Another embodiment of the present invention includes a cleaning solution, (e), comprising an aqueous solution of one or more hydroxycarboxylic acid(s) or one or more non-alkali metal salt(s) of one or more hydroxycarboxylic acid(s); one or more surfactant(s); one or more reducing agent(s); optionally, one or more pH adjustor(s); optionally, one or more complexing agent(s) for Cu(I) ions; optionally, one or more corrosion inhibitor(s) substantially free of nitrogen and substantially free of sulfur; and optionally, one or more oxygen scavenger(s). The pH of the cleaning solution is >8 and <13.

Another embodiment of the present invention includes a cleaning solution, (f), comprising an aqueous solution of one or more hydroxycarboxylic acid(s) or one or more non-alkali metal salt(s) of one or more hydroxycarboxylic acid(s); optionally, one or more surfactant(s); optionally, one or more reducing agent(s); and optionally, one or more pH adjustor(s). The pH of the cleaning solution is <2.5.

Another embodiment of the present invention includes a cleaning solution, (g), comprising an aqueous solution of one or more hydroxycarboxylic acid(s) or one or more non-alkali metal salt(s) of one or more hydroxycarboxylic acid(s); one or more surfactant(s); one or more reducing agent(s); optionally, one or more pH adjustor(s); and one or more fluoride compound(s) selected from the group consisting of hydrogen fluoride, tetrafluoroborate, and non-metal salts of hydrofluoric acid. The pH of the cleaning solution is >0.5 and <2.5.

Another embodiment of the present invention includes a cleaning solution, (h), comprising an aqueous solution of one or more hydroxycarboxylic acid(s) or one or more non-alkali metal salt(s) of one or more hydroxycarboxylic acid(s); one or more surfactant(s); one or more reducing agent(s); optionally, one or more pH adjustor(s); optionally, one or more complexing agent(s) for Cu(I) ions; and one or more fluoride compound(s) selected from the group consisting of hydrogen fluoride, tetrafluoroborate, and non-metal salts of hydrofluoric acid. The pH of the cleaning solution is >2.5 and <5.

Another embodiment of the present invention includes a cleaning solution, (i), comprising an aqueous solution of one or more hydroxycarboxylic acid(s) or one or more non-alkali metal salt(s) of one or more hydroxycarboxylic acid(s); one or more surfactant(s); one or more reducing agent(s); optionally, one or more pH adjustor(s); optionally, one or more complexing agent(s) for Cu(I) ions; optionally, one or more corrosion inhibitor(s) substantially free of nitrogen and substantially free of sulfur; optionally, one or more oxygen scavenger(s); and one or more fluoride compound(s) selected from the group consisting of hydrogen fluoride, tetrafluoroborate, and non-metal salts of hydrofluoric acid. The pH of the cleaning solution is >5 and <8.

Another embodiment of the present invention includes a cleaning solution, (j), comprising an aqueous solution of one or more hydroxycarboxylic acid(s) or one or more non-alkali metal salt(s) of one or more hydroxycarboxylic acid(s); one or more surfactant(s); one or more reducing agent(s); optionally, one or more pH adjustor(s); optionally, one or more complexing agent(s) for Cu(I) ions; optionally, one or more corrosion inhibitor(s) substantially free of nitrogen and substantially free of sulfur; optionally, one or more oxygen scavenger(s); and one or more fluoride compound(s) selected from the group consisting of hydrogen fluoride, tetrafluoroborate, and non-metal salts of hydrofluoric acid. The pH of the cleaning solution is >8 and <13.

Another embodiment of the present invention includes a cleaning solution, (k), comprising an aqueous solution of one or more hydroxycarboxylic acid(s) or one or more non-alkali metal salt(s) of one or more hydroxycarboxylic acid(s); optionally, one or more surfactant(s); optionally, one or more reducing agent(s); optionally, one or more pH adjustor(s); and one or more fluoride compound(s) selected from the group consisting of hydrogen fluoride, tetrafluoroborate, and non-metal salts of hydrofluoric acid. The pH of the cleaning solution is <2.5.

Another embodiment of the present invention includes a cleaning solution, (I), comprising an aqueous solution of one or more hydroxycarboxylic acid(s) or one or more non-alkali metal salt(s) of one or more hydroxycarboxylic acid(s); optionally, one or more surfactant(s); one or more oxidizer(s); and optionally, one or more pH adjustor(s). The pH of the cleaning solution is <2.5.

Another embodiment of the present invention includes a cleaning solution, (m), comprising an aqueous solution of one or more hydroxycarboxylic acid(s) or one or more non-alkali metal salt(s) of one or more hydroxycarboxylic acid(s); one or more surfactant(s); optionally, one or more reducing agent(s); and optionally, one or more pH adjustor(s). The pH of the cleaning solution is >1 and <6. The cleaning solution for this embodiment of the present invention is preferably used prior to electroless deposition of a cap layer that is accomplished with an electroless deposition solution comprising the one or more hydroxycarboxylic acid(s) or the one or more non-alkali metal salt(s) of the one or more hydroxycarboxylic acid(s); the one or more surfactant(s); optionally, the one or more reducing agent(s); and optionally, the one or more pH adjustor(s) used in the cleaning solution.

Another embodiment of the present invention includes a cleaning solution, (n), comprising an aqueous solution of one or more hydroxycarboxylic acid(s) or one or more non-alkali metal salt(s) of one or more hydroxycarboxylic acid(s); optionally, one or more surfactant(s); optionally, one or more reducing agent(s); and optionally, one or more pH adjustor(s). The pH of the cleaning solution is >1 and <6. The cleaning solution for this embodiment of the present invention is preferably used prior to electroless deposition of a cap layer that is accomplished with an electroless deposition solution comprising the one or more hydroxycarboxylic acid(s) or the one or more non-alkali metal salt(s) of the one or more hydroxycarboxylic acid(s); the one or more surfactant(s); optionally, the one or more reducing agent(s); and optionally, the one or more pH adjustor(s) used in the cleaning solution.

The cleaning solutions presented above are summarized in TABLE 1. Shown in TABLE 1 are the pH range for the cleaning solution, additives present in the cleaning solution indicated with "P" for present, and additives that are optionally present indicated with "O" for optional. Each of the additives is given a Roman numeral notation that is defined at the bottom of the table.

For embodiments of the present invention, suitable hydroxycarboxylic acids include substantially any organic compound which has at least one carboxylic group (—COOH) and at least one hydroxy group (—OH). The hydroxy group (—OH) is attached to an alkyl group; consequently, compounds such as phenols and their derivatives are excluded. Numerous compounds are suitable for use as the hydroxycarboxylic acids or non-alkali metal salts of hydroxycarboxylic acids in embodiments of the present invention. Hydroxycarboxylic acids for embodiments of the present invention preferably have the general formula HO—R—COOH where R is an alky hydrocarbon. Embodiments of the present invention include one or more carboxylic groups (—COOH) and one or more hydroxy groups (—OH) attached to the alky hydrocarbon. Examples of hydroxycarboxylic acids for embodiments of the present invention include, but are not limited to, citric acid (2-hydroxy-1,2,3-propane tricarboxylic acid), lactic acid (2-hydroxypropanoic acid), and malonic acid (propanedioic acid). Preferred embodiments of the present invention use concentrations of the hydroxycarboxylic acid or non-alkali metal salt of the hydroxycarboxylic acid in the range from about 0.005 g/L to about 100 g/L.

Embodiments of the present invention may include cleaning solutions that contain one or more additional additives. As an option, some embodiments of the present invention may include cleaning solutions that also contain one or more surfactant(s). The surfactant is included so as to provide adequate wetting of the substrate during the cleaning. Preferably, the entire surface of the substrate is adequately wetted by the cleaning solution so that the dielectric areas of the substrate are wetted and the metal areas of the substrate are wetted. Numerous compounds are suitable for use as surfactants in embodiments of the present invention. A list of surfactants for embodiments of the present invention includes, but is not limited to, anionic surfactants, cationic surfactants, nonionic surfactants, amphoteric surfactants, and combinations thereof. Some embodiments of the present invention include one or more surfactant(s) in the cleaning solution in amounts ranging from about 10 parts per million to about 2000 parts per million.

As an option, some embodiments of the present invention include cleaning solutions that also contain one or more reducing agent(s). The reducing agent is selected so as to be substantially incapable of scavenging for dissolved oxygen. More specifically, the reducing agent is selected so as to provide a function other than scavenging for dissolved oxygen in the cleaning solution. A primary function of the reducing agent is to minimize unwanted anodic dissolution of the metal. Depending on the type of reducing agent, the oxidation of these compounds is energetically more favorable than the oxidation and dissolution of the copper. Numerous compounds are suitable for use as reducing agents in embodiments of the present invention. A list of reducing agents for some embodiments of the present invention includes, but is not limited to, boron containing reducing agents, hypophosphites, aldehydes, and combinations thereof. Some embodiments of the present invention include one or more reducing agents in the cleaning solution in amounts ranging from about 0.005 gram per liter to about 35 grams per liter.

As an option for some embodiments of the present invention, the cleaning solution further comprises one or more pH adjustor(s) to produce the pH or pH range for the cleaning solution. As an option, the pH adjustors can be organic or non-halide containing inorganic acids with a $pK_a$ value less than 2.5. The pH adjustor can also be organic or non-halide containing inorganic bases such as amines or imines with a $pK_b$ value above 7.5. Preferably, cleaning solutions according to embodiments of the present invention substantially do not include inorganic acids having strong oxidizing character such as nitric acid and such as peroxodisulfuric acid. It is also preferred that cleaning solutions according to embodiments of the present invention substantially do not include metal containing acids such as chromic acid. It is to be understood that the amount of the one or more pH adjustor(s) is selected so as to be sufficient to provide a desired pH for the cleaning solution. The amount will be determined, in part, by the desired pH for the cleaning solution, the chemical properties of the pH adjustor, and the amount and chemical properties of the other components of the cleaning solution. In summary, an effective amount of the one or more pH adjustor(s) is included so as to produce the desired pH for the cleaning solution.

As an option, some embodiments of the present invention may include cleaning solutions that also contain one or more complexing agent(s) for Cu(I) ions. Numerous compounds are suitable for use as complexing agents in embodiments of the present invention. A list of complexing agents for embodiments of the present invention includes, but is not limited to, all non-sulfur containing complexing agents which form at least the same or more stable complexes with Cu(I) ions than with Cu(II) ions. A list of complexing agents for some embodiments of the present invention includes, but is not limited to, carboxylic acids, hydroxycarboxylic acids, amino acids, phosphonic acid, phytic acid, and combinations thereof. Some embodiments of the present invention include one or more complexing agent(s) in the cleaning solution in amounts ranging from about 0.1 gram per liter to about 50 grams per liter.

As an option, some embodiments of the present invention may include cleaning solutions that also contain one or more corrosion inhibitor(s) free of nitrogen and sulfur to substantially protect the metal or retard the dissolution of the metal in the cleaning solution. Numerous compounds are suitable for use as corrosion inhibitors in embodiments of the present invention. Some embodiments of the present invention include one or more corrosion inhibitors in the cleaning solution in amounts ranging from about 0.01 gram per liter to about 5 grams per liter.

As an option, some embodiments of the present invention may include cleaning solutions that also contain one or more oxygen scavenger(s) to remove dissolved oxygen from the cleaning solution. More specifically, the oxygen scavenger provides a lower concentration of dissolved oxygen in the cleaning solution. Preferably, the amount of dissolved oxygen is kept to a minimum so as to substantially prevent oxidation of the metal by the dissolved oxygen. Numerous compounds are suitable for use as oxygen scavengers for dissolved oxygen in embodiments of the present invention. Some embodiments of the present invention include one or more oxygen scavengers present in the cleaning solution in amounts ranging from about 0.1 gram per liter to about 50 grams per liter. Preferred embodiments of the present invention maintain concentrations of dissolved oxygen in the cleaning solution at less than 5 parts per million (ppm). For some embodiments of the present invention, the low levels of dissolved oxygen are obtained by providing a sufficient amount of one or more oxygen scavengers(s).

As an option, some embodiments of the present invention may include cleaning solutions that also contain one or more fluoride compounds(s). The fluoride compounds are provided so as to improve the cleaning solution. Preferred embodiments of the present invention use fluoride compounds such as hydrogen fluoride, tetrafluoroborate, non-metal salts of hydrofluoric acid, and mixtures thereof. Some embodiments of the present invention include one or more of the fluoride compound(s) in the cleaning solution in amounts ranging from about 0.1% to about 0.5%.

As an option, some embodiments of the present invention may include cleaning solutions that also contain one or more oxidizer(s). The oxidizers are provided so as to improve the cleaning capability of the cleaning solution. Some embodiments of the present invention include one or more of the oxidizer(s) in the cleaning solution in amounts ranging from about 0.1 gram per liter to about 50 grams per liter.

As an option for some embodiments of the present invention, some of the cleaning solutions are particularly suitable for processes that include using a single cleaning solution. Alternatively, other processes may include using a first cleaning solution for an initial cleaning of the substrate and a second cleaning solution for a more thorough or final cleaning of the substrate. TABLE 2 shows a subset of cleaning solutions listed in TABLE 1 that are particularly suited for use as a single cleaning solution. Similarly, TABLE 3 shows a subset of cleaning solutions listed in TABLE 1 that are particularly suited for use as a first cleaning solution. TABLE 4 shows a subset of cleaning solutions listed in TABLE 1 that are particularly suited for use as a second cleaning solution.

Cleaning solutions according to embodiments of the present invention can be integrated into manufacturing operations to produce electronic devices by way of a variety of process flows. Furthermore, some of the cleaning solutions according to embodiments of the present invention have compositions which allow the implementation of process flows that cannot be or cannot be easily accomplished using standard cleaning solutions for such applications. In other words, cleaning solutions according to embodiments of the present invention enable the use of process flows that can yield improved results for the substrates and/or improvements in manufacturing productivity.

Process Flows

Reference is now made to FIG. 1 where there is shown a process flow 30 for use in the fabrication of devices according to one embodiment of the present invention. The process flow 30 begins with start 50 and further includes a clean with solution 75, an electroless plating 150, and is completed with end 175. The process flow 30 is performed on a substrate having a metal and dielectric damascene metallization; preferably the metal is copper and the dielectric is a low k dielectric. The clean with solution 75 involves cleaning the surface of the substrate in preparation for electroless deposition of a cap layer on the copper. Although the cap layer is substantially only deposited onto the copper portions of the substrate, substantially the entire surface of the substrate needs to be cleaned, including both the copper areas and the dielectric areas.

For the process flow 30, the clean with solution 75 is accomplished using one of the cleaning solutions substantially as disclosed above. More specifically, the cleaning solution is exposed to the surface of the substrate so that the substrate is wetted by the cleaning solution. As an option, the cleaning solution may be a cleaning solution particularly suited for use in a single cleaning process. Cleaning solutions for such processes are preferably selected from cleaning solutions such as those listed in TABLE 2 described above. Preferably, the cleaning solution only comprises components that substantially do not obstruct the operation or performance of the electroless deposition solution if present therein. In other words, the components of the cleaning solution may be present in the electroless deposition solution as an intentional addition to the electroless deposition solution or as a result such as from being dragged into the electroless deposition solution or present from a cleaning solution residue from the substrate.

Alternatively, the clean with solution 75 can be accomplished using two cleaning solutions substantially as disclosed above. More specifically, a first cleaning solution can be exposed to the substrate to accomplish an initial clean of the substrate; later, a second cleaning solution can be exposed to the substrate to accomplish a more thorough or final clean of the substrate. The first cleaning solution is preferably a cleaning solution such as those presented in TABLE 3. The second cleaning solution is preferably a cleaning solution such as those presented in TABLE 4.

In general, the clean with solution 75 includes wetting the surface of the substrate to be cleaned with the cleaning solution. The cleaning solution has properties sufficient to accomplish the clean or a portion thereof. The cleaning solution is applied to the surface to be cleaned under conditions sufficient for the clean. More specifically, factors such as solution compositions, contact time with the surface to be cleaned, and temperature are selected to be sufficient for the clean.

The electroless plating 150 is also accomplished using wet processing. Descriptions of some technologies for electroless deposition of cap layers for device metallization applications can be found in US patents: U.S. Pat. No. 6,794,288 to Kolics, U.S. Pat. No. 6,902,605 to Kolics, and U.S. Pat. No. 6,911,067 to Kolics; the contents of all of these patents and/or applications are incorporated herein, in their entirety, by this reference.

One of the benefits of using solutions according to embodiments of the present invention is that, as an option, the process flow 30 can be performed substantially without dewetting or drying the surface of the substrate. In other words, the surface of the substrate to be cleaned and later subjected to electroless deposition has a layer of liquid present, i.e. is wetted, throughout the process flow 30 from the start 50 through to the end 175. According to preferred embodiments of the present invention, the process flow 30 is performed with a substrate maintained wetted from the start 50 through to the end 175. The wetted substrate has a substantially continuous film of liquid over the surface such as having the surface of the substrate hydrophilic with respect to the liquid. The wetted substrate is in contrast to either a de-wetted substrate or a dry substrate. The de-wetted substrate is one where the film of the liquid has been broken so that droplets may be formed on the substrate and areas of the substrate are uncovered by the liquid. The dry substrate is one where the film of liquid is substantially absent and substantially the entire substrate surface is uncovered by the liquid. Preferred embodiments of the process flow 30 are performed so that the clean with solution 75 and the electroless plating 150 and all other acts that may be included between the start 50 and the end 175 do not include drying or dewetting the substrate.

The exclusion of drying steps and the exclusion of dewetting steps for the process flow 30 increases the productivity for processing the substrates. This is in contrast to the standard processing of substrates where typically there are one or more drying steps during and/or between cleaning the substrate and electroless deposition of the cap layer. Another benefit that is believed to occur for embodiments of the present invention is that the exclusion of drying steps and the exclusion of dewetting steps for the process flow 30 also produces improvements in cleaning the substrate and/or maintaining the cleaned substrate.

Figure 2:
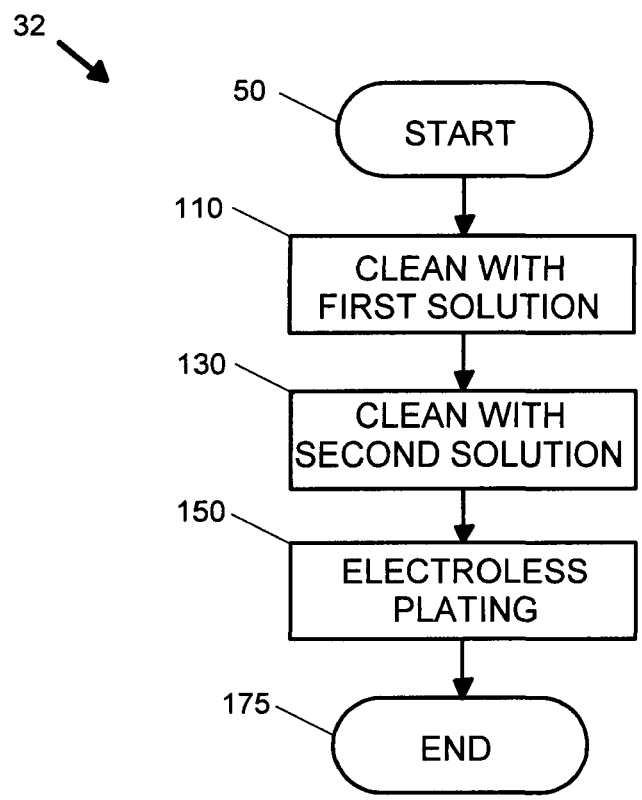
FIG. 2 is a process flow diagram of an embodiment of the present invention.

As indicated above, an option for embodiments of the present invention includes using two cleaning solutions to clean a substrate. Such an embodiment will now be described with reference to FIG. 2 where there is shown a process flow 32. The process flow 32 is substantially the same as process flow 30 with the exception that clean with solution 75 has been replaced with clean with first solution 110 and clean with second solution 130. More specifically, the process flow 32 begins with start 50 and further includes clean with first solution 110, clean with second solution 130, electroless plating 150, and is completed with end 175. For process flow 32, the electroless plating 150 is essentially the same as described above for process flow 30. The clean with first solution 110 includes using a cleaning solution such as one of the cleaning solutions listed in TABLE 3. The clean with second solution 130 includes using a cleaning solution such as one of the cleaning solutions listed in TABLE 4. The clean with first solution 110 is accomplished by exposing the substrate to a first cleaning solution so that the first cleaning solution wets substantially the entire surface of the substrate to be cleaned. The clean with second solution 130 is accomplished by exposing the substrate to a second cleaning solution so that the second cleaning solution wets substantially the entire surface to be cleaned for the substrate.

As an option for some embodiments of the present invention, process flow 30 and/or process flow 32 may include additional acts such as acts to rinse the substrate and such as acts to spin the substrate to remove excess liquid substantially without drying or dewetting the surface of the substrate. The acts to rinse the substrate include wetting the surface of the substrate with deionized water or deionized water having one or more surfactant(s). The deionized water or deionized water having one or more surfactants is exposed to the substrate so as to wet substantially the entire surface of the substrate. The acts to spin the substrate include spinning the substrate at a velocity sufficient to reduce the amount of liquid, i.e., spinning off excess liquid, on the surface of the substrate substantially without dewetting or drying the substrate. In other words, the acts to spin the substrate to remove excess liquid is performed so that the substrate maintains a substantially continuous film of liquid while reducing the total amount of liquid on the substrate surface. Optionally, the one or more act(s) to rinse the substrate and/or the one or more act(s) to spin the substrate may be executed before, during, or after the exposing the surface of the substrate to the cleaning solution; preferably, all are performed substantially without drying or dewetting the substrate. The acts to spin the substrate may be used to remove excess liquid provided to rinse the substrate or to remove excess cleaning solution such as the single cleaning solutions, the first cleaning solutions, and the second cleaning solutions described above.

Figure 3:
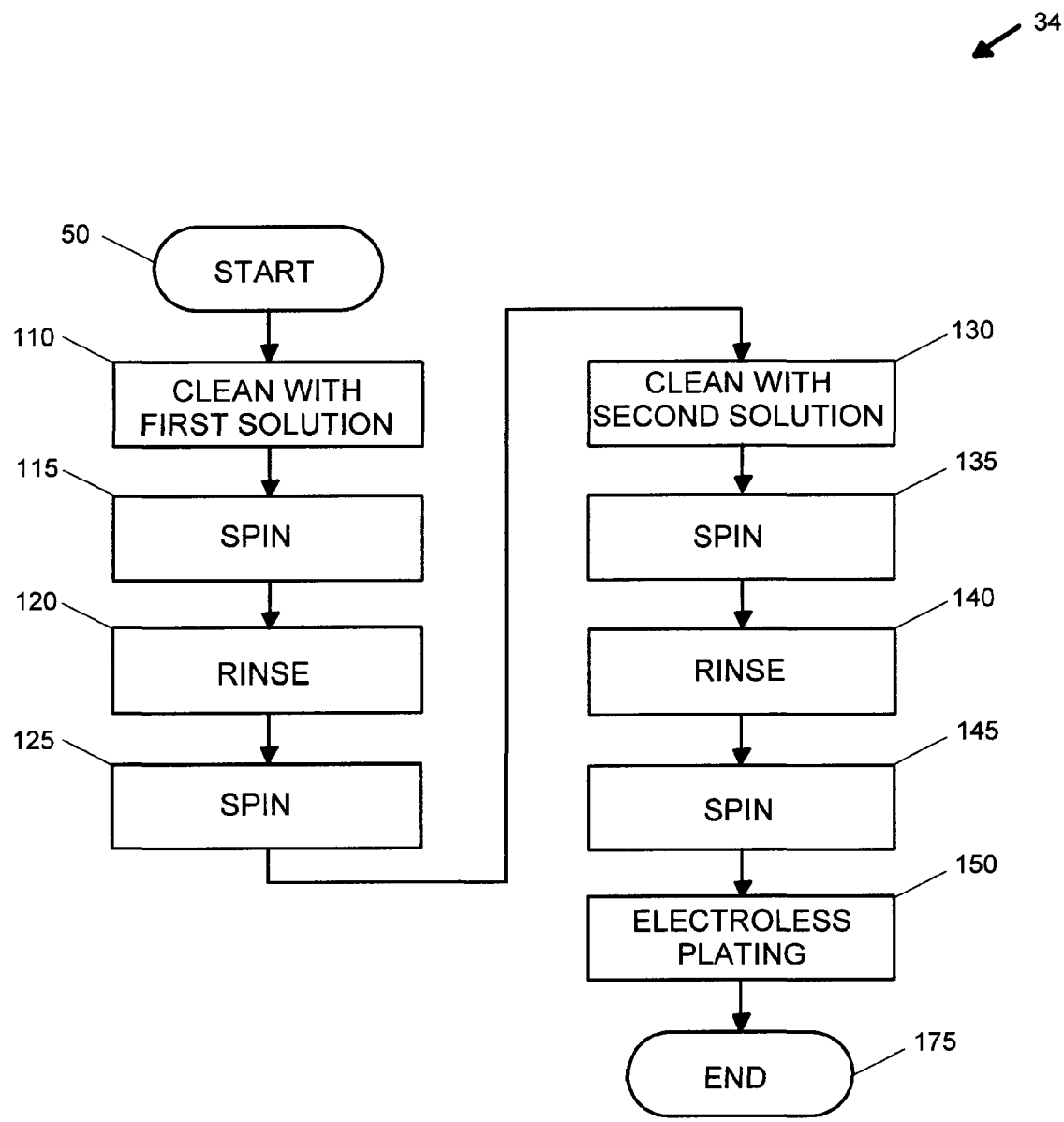
FIG. 3 is a process flow diagram of an embodiment of the present invention.

Reference is now made to FIG. 3 where there is shown a process flow 34 according to an embodiment of the present invention. The process flow 34 is substantially the same as process flow 32 but having additional modifications. The process flow 34 begins with start 50 and includes clean with first solution 110, spin 115, rinse 120, spin 125, clean with second solution 130, spin 135, rinse 140, spin 145, electroless plating 150, and is completed with end 175. For process flow 34, the clean with first solution 110, the clean with second solution 130, and the electroless plating 150 are essentially the same as described above for process flow 32.

The spin 115 includes spinning the substrate at a velocity sufficient to reduce the amount of a first cleaning solution used for the clean with first solution 110, i.e., spinning off excess liquid. For preferred embodiments, excess liquid on the surface of the substrate is removed substantially without dewetting or drying the substrate.

The rinse 120 includes wetting the surface of the substrate with deionized water or deionized water having one or more surfactant(s). The deionized water or deionized water having one or more surfactants is exposed to the substrate so as to wet substantially the entire surface of the substrate subjected to the first cleaning solution.

The spin 125 includes spinning the substrate at a velocity sufficient to reduce the amount of the deionized water or the deionized water having one or more surfactant(s) used for the rinse 120, i.e., spinning off excess liquid. For preferred embodiments, excess liquid on the surface of the substrate is removed substantially without dewetting or drying the substrate.

The spin 135 includes spinning the substrate at a velocity sufficient to reduce the amount of a second cleaning solution used for the clean with second solution 110, i.e., spinning off excess liquid. More specifically, excess liquid on the surface of the substrate is removed substantially without dewetting or drying the substrate.

The rinse 140 includes wetting the surface of the substrate with deionized water or deionized water having one or more surfactant(s). The deionized water or deionized water having one or more surfactant(s) is exposed to the substrate so as to wet substantially the entire surface of the substrate subjected to the second cleaning solution.

The spin 145 includes spinning the substrate at a velocity sufficient to reduce the amount of the deionized water or the deionized water having one or more surfactant(s) used for the rinse 140, i.e., spinning off excess liquid. For preferred embodiments, excess liquid on the surface of the substrate is removed substantially without dewetting or drying the substrate.

Preferred embodiments of process flow 34 include using a first cleaning solution such as first cleaning solutions shown in TABLE 3 and a second cleaning solution such as second cleaning solutions shown in TABLE 4. In more preferred embodiments, process flow 34 uses a first cleaning solution such as cleaning solutions identified above as (b), (c), (d), (e), (f), (g), (h), (i), (j), (k), and (l) and uses a second cleaning solution such as cleaning solutions identified above as (b), (c), (d), (g), (h), (i), (j), (k), (l), (m), and (n).

Figure 4:
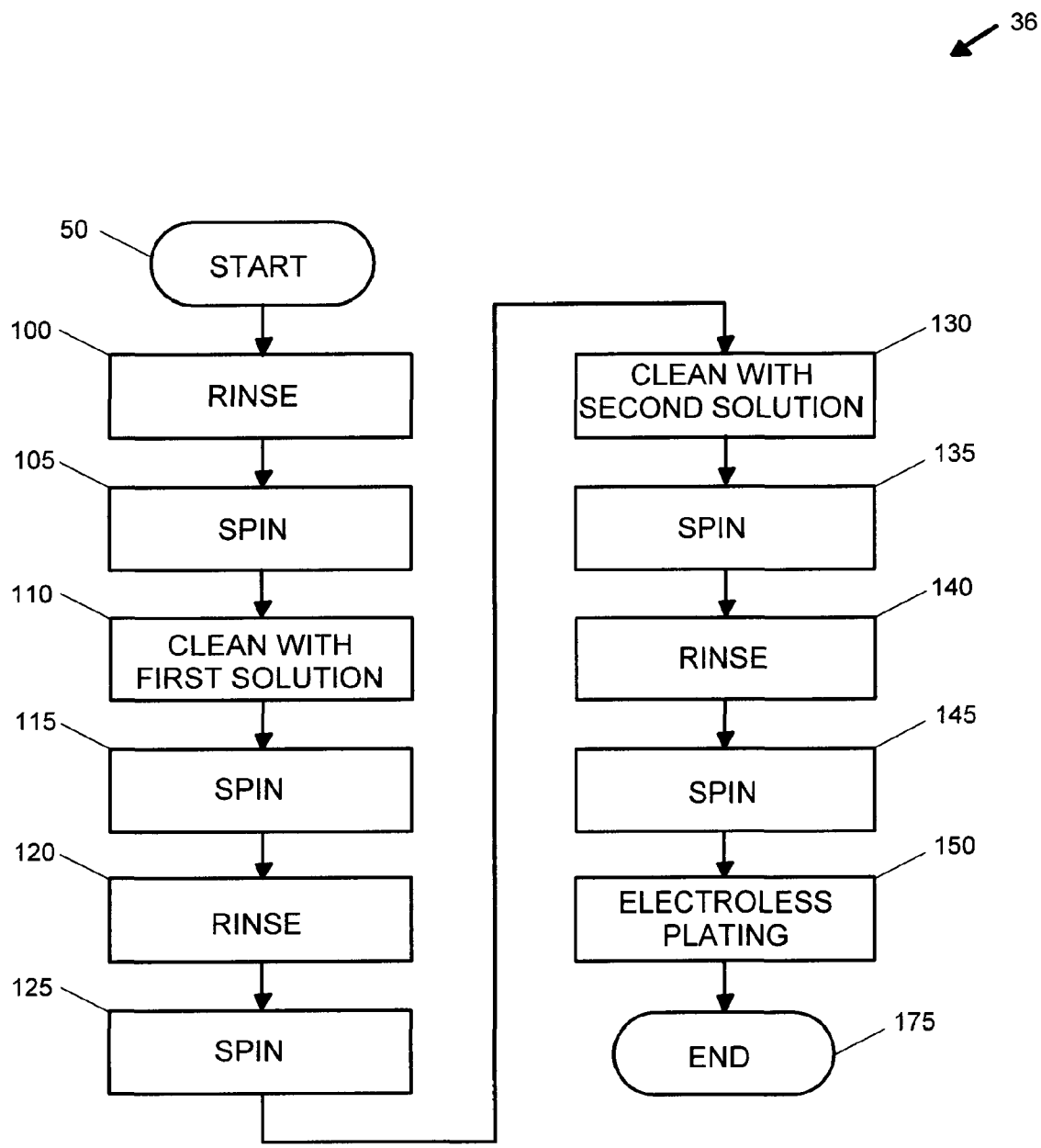
FIG. 4 is a process flow diagram of an embodiment of the present invention.

Reference is now made to FIG. 4 where there is shown a process flow 36 according to an embodiment of the present invention. The process flow 36 begins with start 50 and includes a rinse 100, a spin 105, a clean with first solution 110, a spin 115, a rinse 120, a spin 125, a clean with second solution 130, a spin 135, a rinse 140, a spin 145, an electroless plating 150 and is completed with end 175. For process flow 36, the clean with first solution 110, the spin 115, the rinse 120, the spin 125, the clean with second solution 130, the spin 135, the rinse 140, the spin 145, and the electroless plating 150 are essentially the same as described above.

The rinse 100 includes wetting the surface of the substrate with deionized water or deionized water having one or more surfactant(s). The deionized water or the deionized water having one or more surfactants is exposed to the substrate so as to wet substantially the entire surface of the substrate to be subjected to a first cleaning solution.

The spin 105 includes spinning the substrate at a velocity sufficient to reduce the amount of the deionized water or the deionized water having one or more surfactants used for the rinse 100, i.e., spinning off excess liquid. For preferred embodiments, excess liquid on the surface of the substrate is removed substantially without dewetting or drying the substrate.

Preferred embodiments of process flow 36 include using a first cleaning solution such as first cleaning solutions shown in TABLE 3 and a second cleaning solution such as second cleaning solutions shown in TABLE 4. In more preferred embodiments, process flow 34 uses a first cleaning solution such as cleaning solutions identified above as (b), (c), (d), (e), (f), (g), (h), (i), (j), (k), and (l) and uses a second cleaning solution such as cleaning solutions identified above as (b), (c), (d), (g), (h), (i), (j), (k), (l), (m), and (n).

Figure 5:
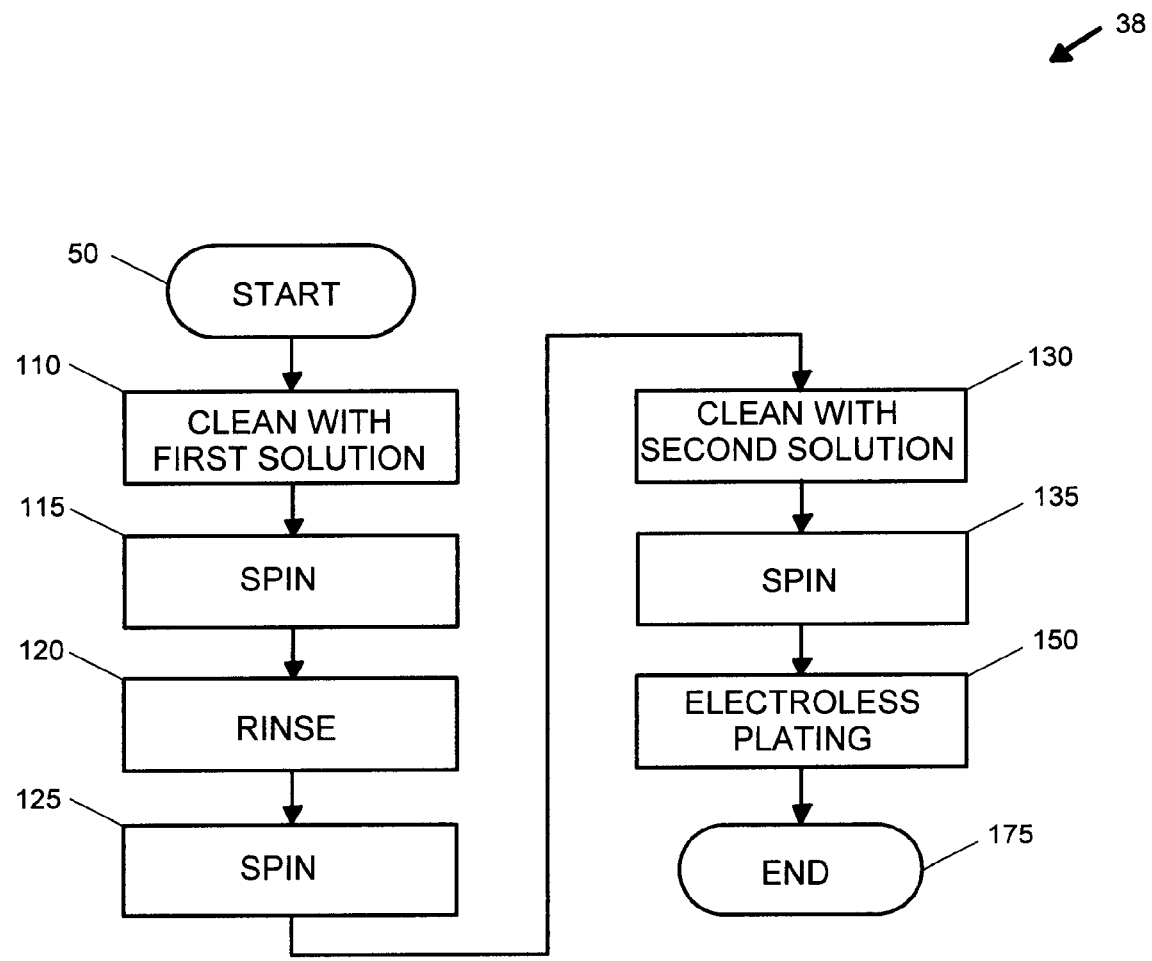
FIG. 5 is a process flow diagram of an embodiment of the present invention.

Reference is now made to FIG. 5 where there is shown a process flow 38 according to an embodiment of the present invention. The process flow 38 begins with start 50 and includes a clean with first solution 110, a spin 115, a rinse 120, a spin 125, a clean with second solution 130, a spin 135, an electroless plating 150 and is completed with end 175. For process flow 38, the clean with first solution 110, the spin 115, the rinse 120, the spin 125, the clean with second solution 130, the spin 135, and the electroless plating 150 are essentially the same as described above. Preferred embodiments of process flow 38 include using a first cleaning solution such as first cleaning solutions shown in TABLE 3 and a second cleaning solution such as second cleaning solutions shown in TABLE 4. In more preferred embodiments, process flow 38 uses a first cleaning solution such as cleaning solutions identified above as (b), (c), (d), (e), (f), (g), (h), (i), (j), (k), and (l) and uses a second cleaning solution such as cleaning solutions identified above as (m) and (n).

Figure 6:
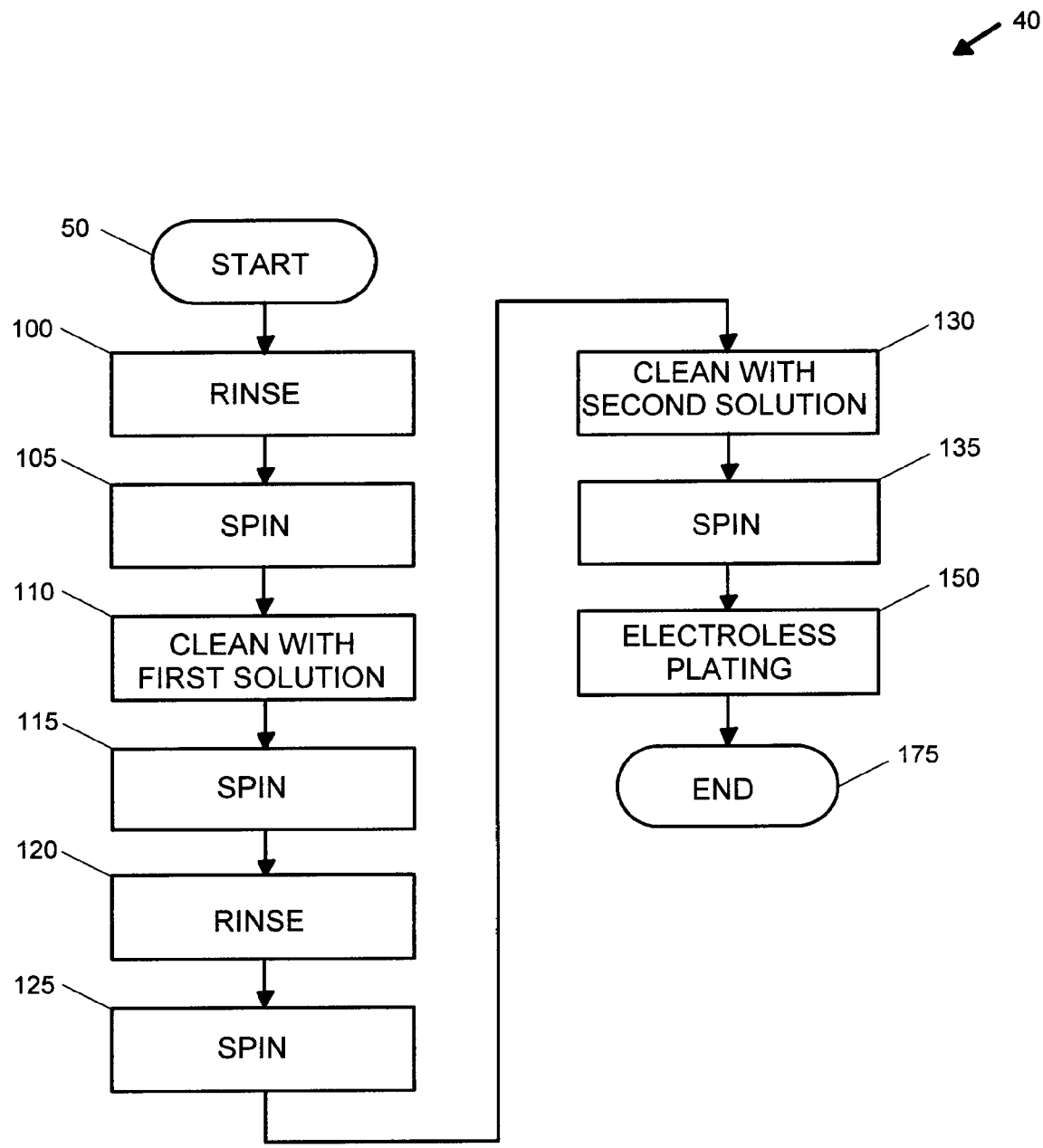
FIG. 6 is a process flow diagram of an embodiment of the present invention.

Reference is now made to FIG. 6 where there is shown a process flow 40 according to an embodiment of the present invention. The process flow 40 begins with start 50 and includes a rinse 100, a spin 105, a clean with first solution 110, a spin 115, a rinse 120, a spin 125, a clean with second solution 130, a spin 135, an electroless plating 150 and is completed with end 175. For process flow 40, the rinse 100, the spin 105, the clean with first solution 110, the spin 115, the rinse 120, the spin 125, the clean with second solution 130, the spin 135, and the electroless plating 150 are essentially the same as described above. Preferred embodiments of process flow 40 include using a first cleaning solution such as first cleaning solutions shown in TABLE 3 and a second cleaning solution such as second cleaning solutions shown in TABLE 4. More preferably, embodiments of process flow 40 use a first cleaning solution such as cleaning solutions identified above as (b), (c), (d), (e), (f), (g), (h), (i), (j), (k), and (l) and uses a second cleaning solution such as cleaning solutions identified above as (m) and (n).

Figure 7:
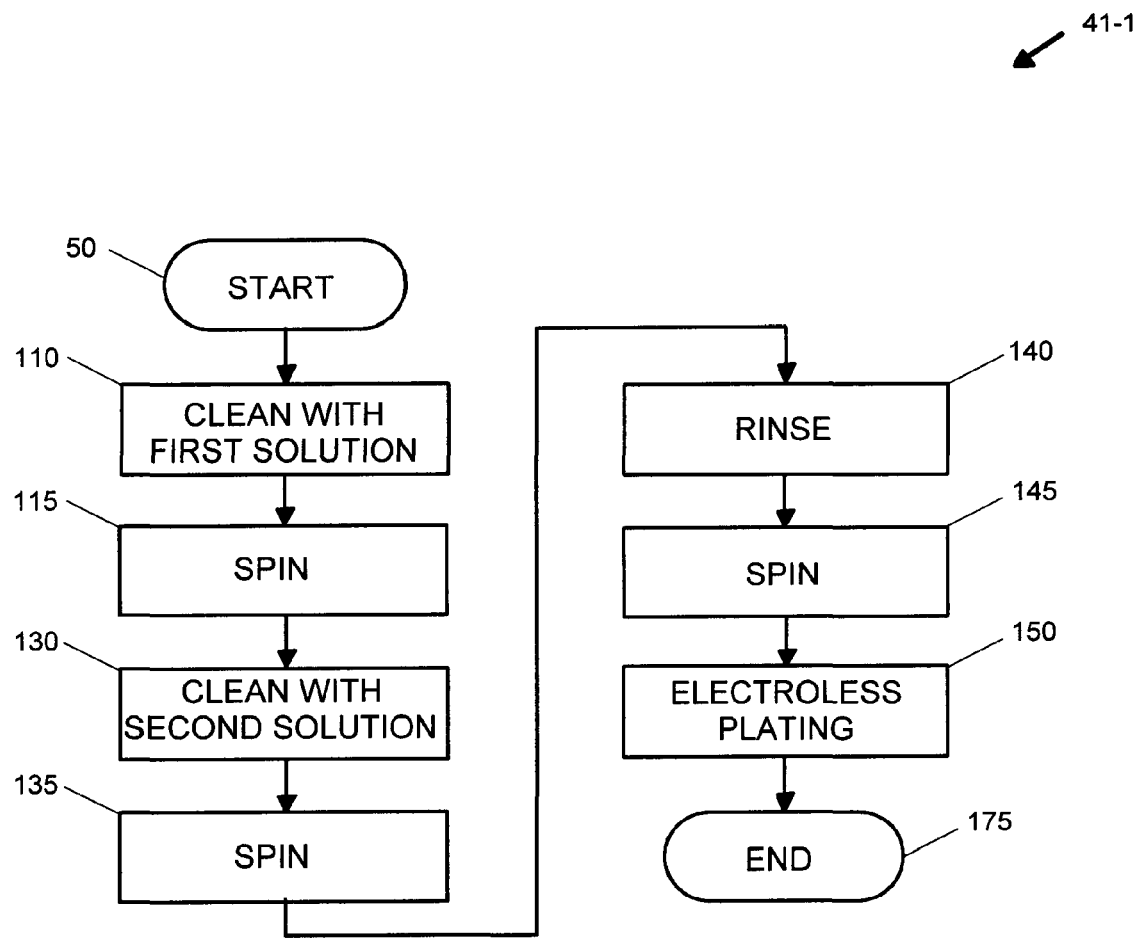
FIG. 7 is a process flow diagram of an embodiment of the present invention.

Reference is now made to FIG. 7 where there is shown a process flow 41-1 according to an embodiment of the present invention. The process flow 41-1 begins with start 50 and includes a clean with first solution 110, a spin 115, a clean with second solution 130, a spin 135, a rinse 140, a spin 145, an electroless plating 150 and is completed with end 175. For process flow 41-1, the clean with first solution 110, the spin 115, the clean with second solution 130, the spin 135, the rinse 140, the spin 145, and the electroless plating 150 are essentially the same as described above. Preferred embodiments of process flow 41-1 include using a first cleaning solution such as preferred first cleaning solutions shown in TABLE 3 and a second cleaning solution such as preferred second cleaning solutions shown in TABLE 4. More preferably, embodiments of process flow 41-1 use a first cleaning solution such as cleaning solutions identified above as (b), (c), (d), (e), (f), (g), (h), (i), (j), (k), and (l) and uses a second cleaning solution such as cleaning solutions identified above as (b), (c), (d), (g), (h), (i), (j), (k), (l), (m), and (n).

Figure 8:
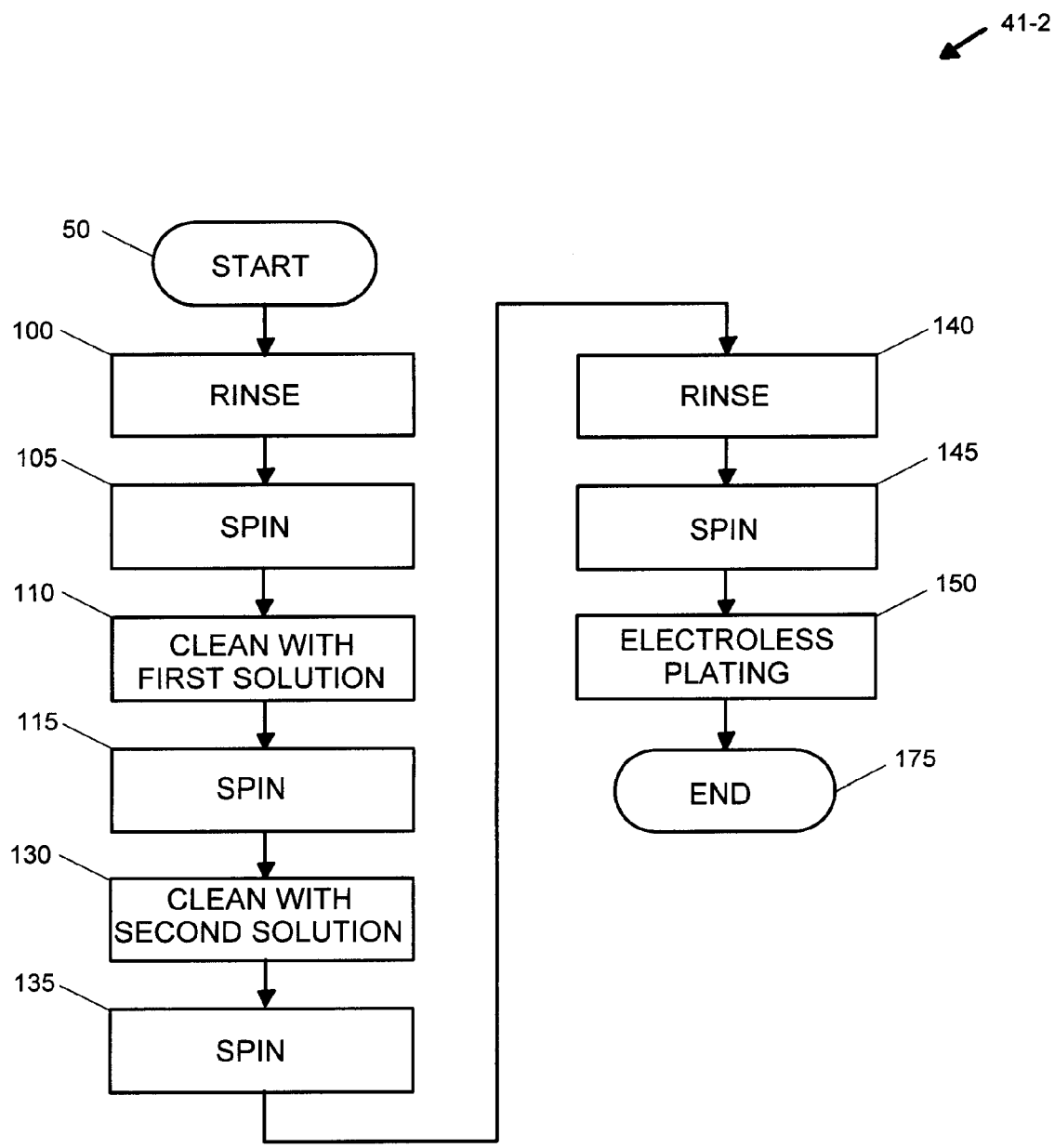
FIG. 8 is a process flow diagram of an embodiment of the present invention.

Reference is now made to FIG. 8 where there is shown a process flow 41-2 according to an embodiment of the present invention. The process flow 41-2 begins with start 50 and includes a rinse 100, a spin 105, a clean with first solution 110, a spin 115, a clean with second solution 130, a spin 135, a rinse 140, a spin 145, an electroless plating 150 and is completed with end 175. For process flow 41-2, the rinse 100, the spin 105, the clean with first solution 110, the spin 115, the clean with second solution 130, the spin 135, the rinse 140, the spin 145, and the electroless plating 150 are essentially the same as described above. Preferred embodiments of process flow 41-2 include using a first cleaning solution such as first cleaning solutions shown in TABLE 3 and a second cleaning solution such as second cleaning solutions shown in TABLE 4. More preferably, embodiments of process flow 41-2 use a first cleaning solution such as cleaning solutions identified above as (b), (c), (d), (e), (f), (g), (h), (i), (j), (k), and (l) and uses a second cleaning solution such as cleaning solutions identified above as (b), (c), (d), (g), (h), (i), (j), (k), (l), (m), and (n).

Figure 9:
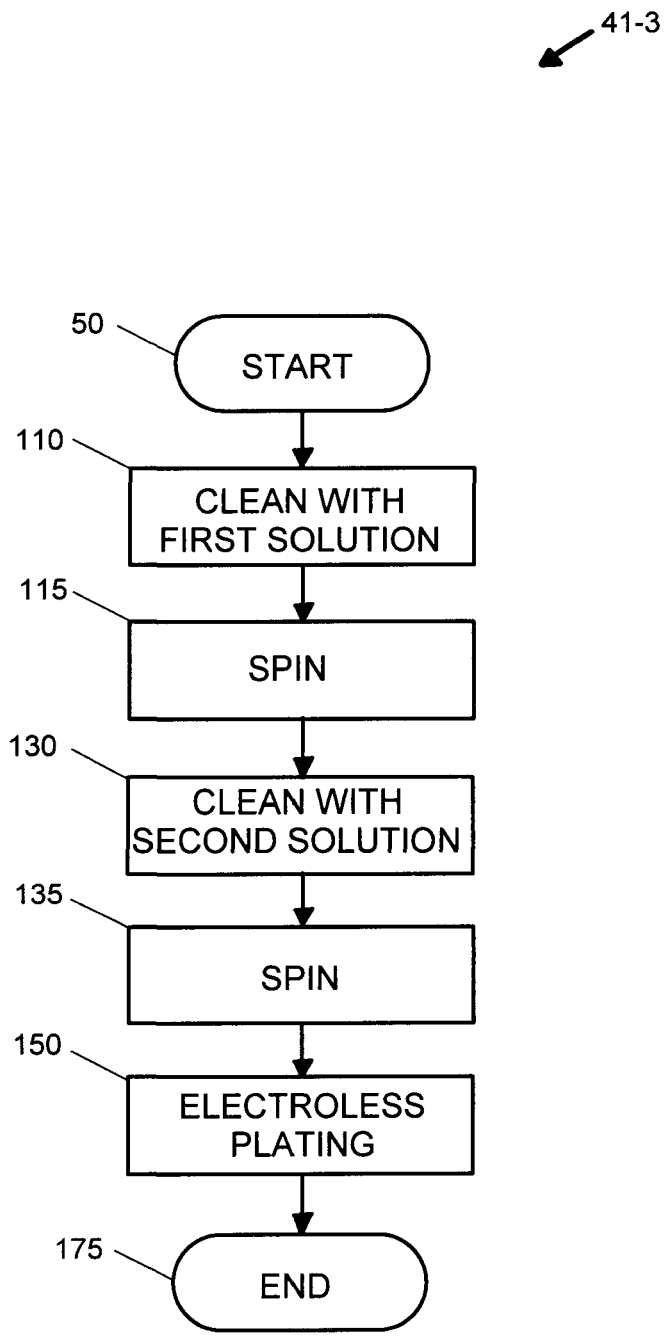
FIG. 9 is a process flow diagram of an embodiment of the present invention.

Reference is now made to FIG. 9 where there is shown a process flow 41-3 according to an embodiment of the present invention. The process flow 41-3 begins with start 50 and includes a clean with first solution 110, a spin 115, a clean with second solution 130, a spin 135, an electroless plating 150 and is completed with end 175. For process flow 41-3, the clean with first solution 110, the spin 115, the clean with second solution 130, the spin 135, and the electroless plating 150 are essentially the same as described above. Preferred embodiments of process flow 41-3 include using a first cleaning solution such as first cleaning solutions shown in TABLE 3 and a second cleaning solutions shown in TABLE 4. More preferably, embodiments of process flow 41-3 use a first cleaning solution such as cleaning solutions identified above as (b), (c), (d), (e), (f), (g), (h), (i), (j), (k), and (l) and uses a second cleaning solution such as cleaning solutions identified above as (m) and (n).

Figure 10:
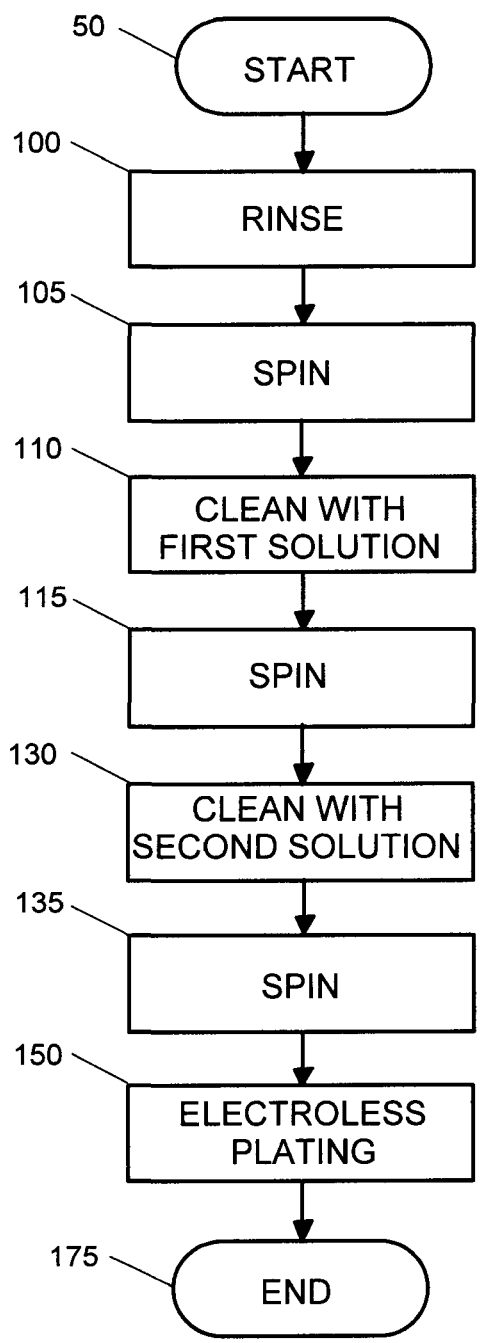
FIG. 10 is a process flow diagram of an embodiment of the present invention.

Reference is now made to FIG. 10 where there is shown a process flow 41-4 according to an embodiment of the present invention. The process flow 41-4 begins with start 50 and includes a rinse 100, a spin 105, a clean with first solution 110, a spin 115, a clean with second solution 130, a spin 135, an electroless plating 150 and is completed with end 175. For process flow 41-4, the rinse 100, the spin 105, the clean with first solution 110, the spin 115, the clean with second solution 130, the spin 135, and the electroless plating 150 are essentially the same as described above. Preferred embodiments of process flow 41-4 include using a first cleaning solution such as first cleaning solutions shown in TABLE 3 and a second cleaning solution such as second cleaning solutions shown in TABLE 4. More preferably, embodiments of process flow 41-4 use a first cleaning solution such as cleaning solutions identified above as (b), (c), (d), (e), (f), (g), (h), (i), (j), (k), and (l) and uses a second cleaning solution such as cleaning solutions identified above as (m) and (n).

Figure 11:
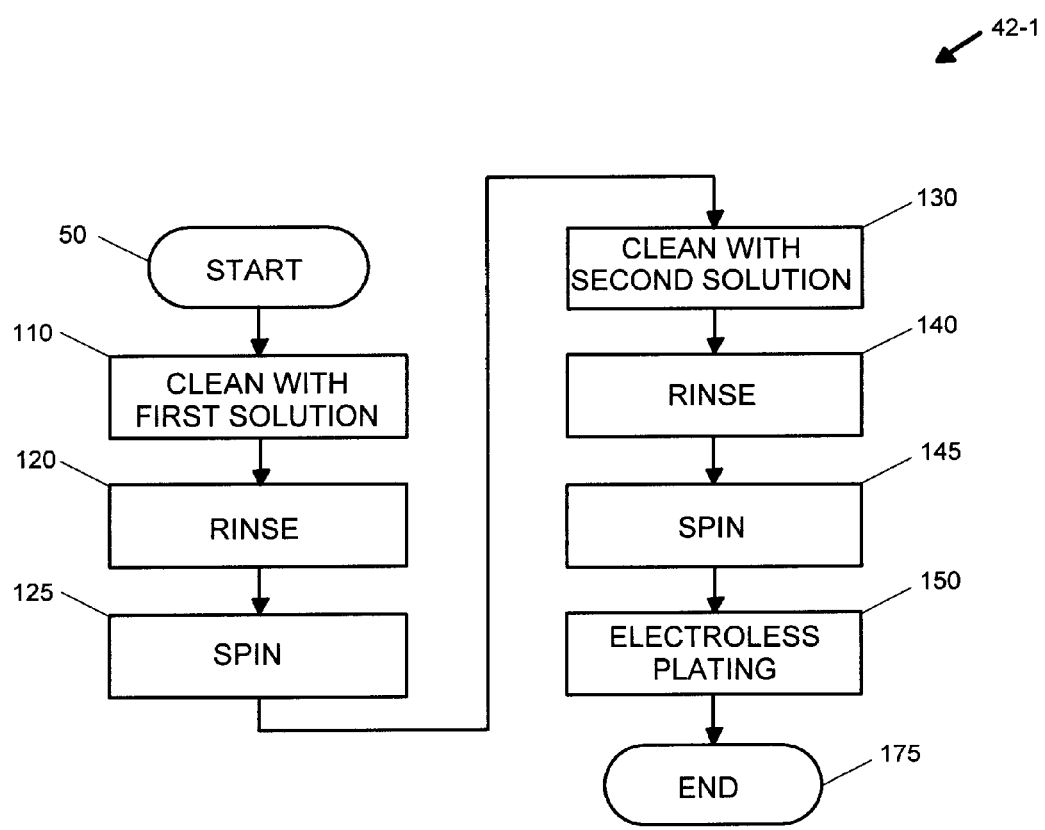
FIG. 11 is a process flow diagram of an embodiment of the present invention.

Reference is now made to FIG. 11 where there is shown a process flow 42-1 according to an embodiment of the present invention. The process flow 42-1 begins with start 50 and includes a clean with first solution 110, a rinse 120, a spin 125, a clean with second solution 130, a rinse 140, a spin 145, an electroless plating 150 and is completed with end 175. For process flow 42-1, the clean with first solution 110, the rinse 120, the spin 125, the clean with second solution 130, the rinse 140, the spin 145, the electroless plating 150 are essentially the same as described above. Preferred embodiments of process flow 42-1 include using a first cleaning solution such as first cleaning solutions shown in TABLE 3 and a second cleaning solution such as second cleaning solutions shown in TABLE 4. In more preferred embodiments, process flow 42-1 uses a first cleaning solution such as cleaning solutions identified above as (b), (c), (d), (e), (f), (g), (h), (i), (j), (k), and (l) and uses a second cleaning solution such as cleaning solutions identified above as (b), (c), (d), (g), (h), (i), (j), (k), (l), (m), and (n).

Figure 12:
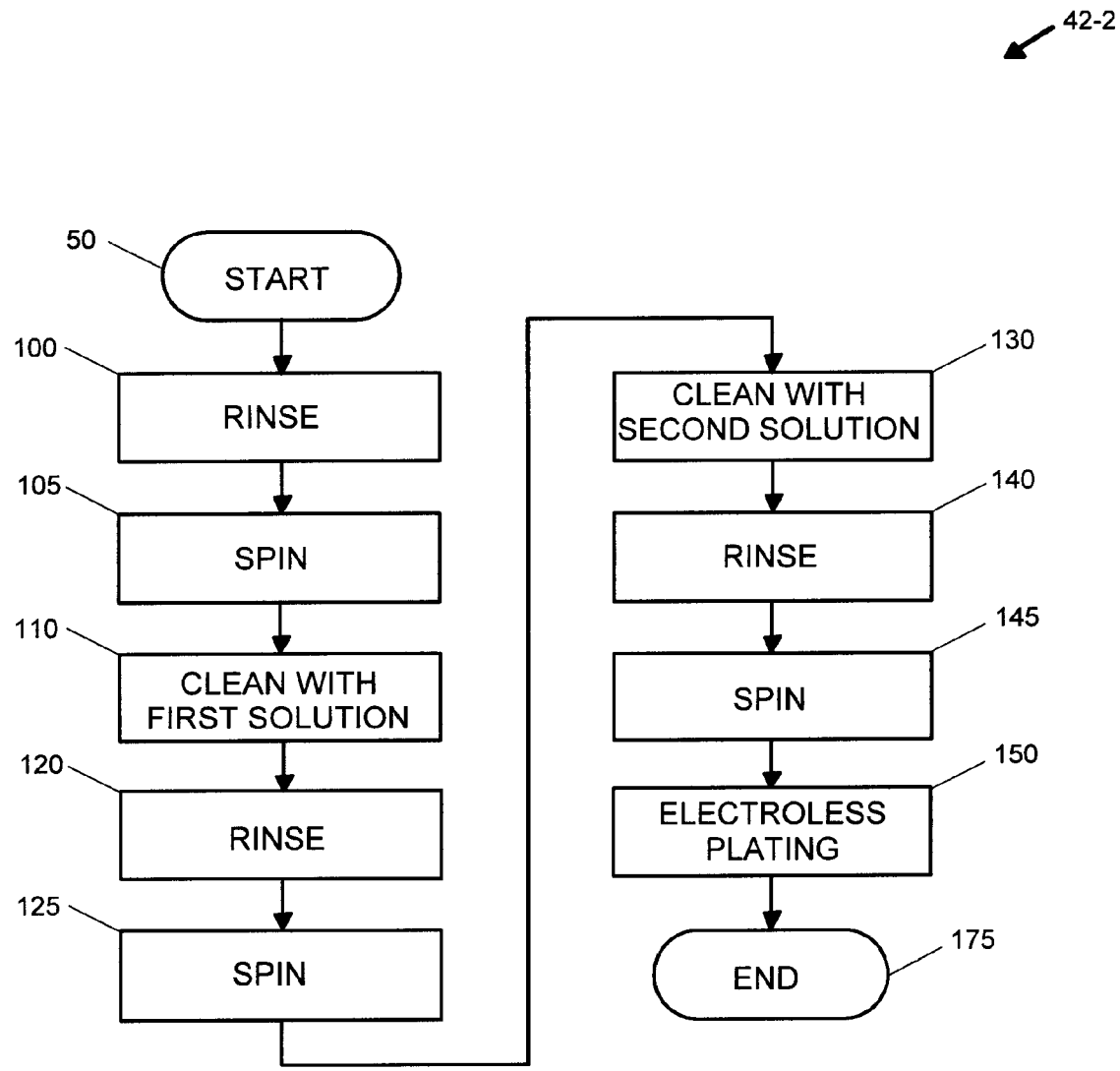
FIG. 12 is a process flow diagram of an embodiment of the present invention.

Reference is now made to FIG. 12 where there is shown a process flow 42-2 according to an embodiment of the present invention. The process flow 42-2 begins with start 50 and includes a rinse 100, a spin 105, a clean with first solution 110, a rinse 120, a spin 125, a clean with second solution 130, a rinse 140, a spin 145, an electroless plating 150 and is completed with end 175. For process flow 42-2, the rinse 100, the spin 105, the clean with first solution 110, the rinse 120, the spin 125, the clean with second solution 130, the rinse 140, the spin 145, the electroless plating 150 are essentially the same as described above. Preferred embodiments of process flow 42-2 include using a first cleaning solution such as first cleaning solutions shown in TABLE 3 and a second cleaning solution such as second cleaning solutions shown in TABLE 4. In more preferred embodiments, process flow 42-2 uses a first cleaning solution such as cleaning solutions identified above as (b), (c), (d), (e), (f), (g), (h), (i), (j), (k), and (l) and uses a second cleaning solution such as cleaning solutions identified above as (b), (c), (d), (g), (h), (i), (j), (k), (l), (m), and (n).

Figure 13:
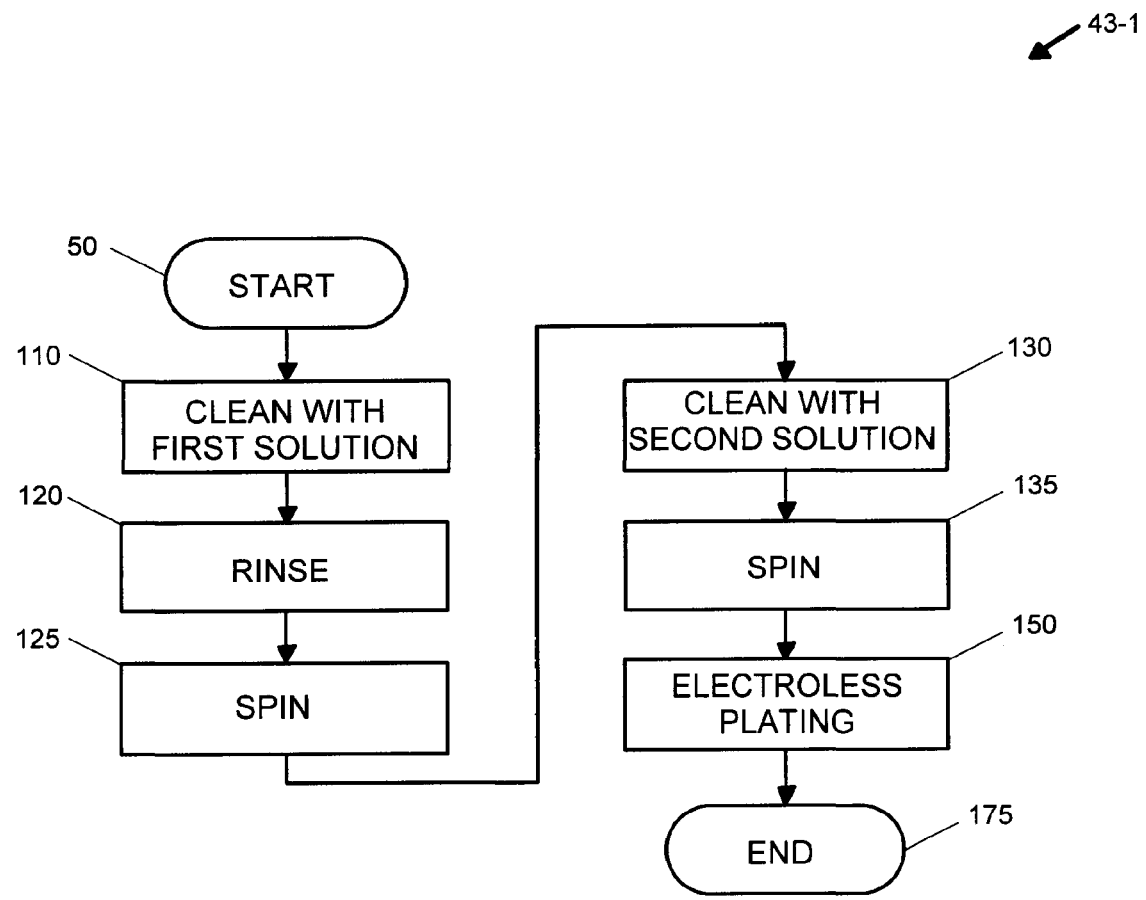
FIG. 13 is a process flow diagram of an embodiment of the present invention.

Reference is now made to FIG. 13 where there is shown a process flow 43-1 according to an embodiment of the present invention. The process flow 43-1 begins with start 50 and includes a clean with first solution 110, a rinse 120, a spin 125, a clean with second solution 130, a spin 135, an electroless plating 150 and is completed with end 175. For process flow 43-1, the clean with first solution 110, the rinse 120, the spin 125, the clean with second solution 130, the spin 135, the electroless plating 150 are essentially the same as described above. Preferred embodiments of process flow 43-1 include using a first cleaning solution such as first cleaning solutions shown in TABLE 3 and a second cleaning solution such as second cleaning solutions shown in TABLE 4. In more preferred embodiments, process flow 43-1 uses a first cleaning solution such as cleaning solutions identified above as (b), (c), (d), (e), (f), (g), (h), (i), (j), (k), and (l) and uses a second cleaning solution such as cleaning solutions identified above as (m) and (n).

Figure 14:
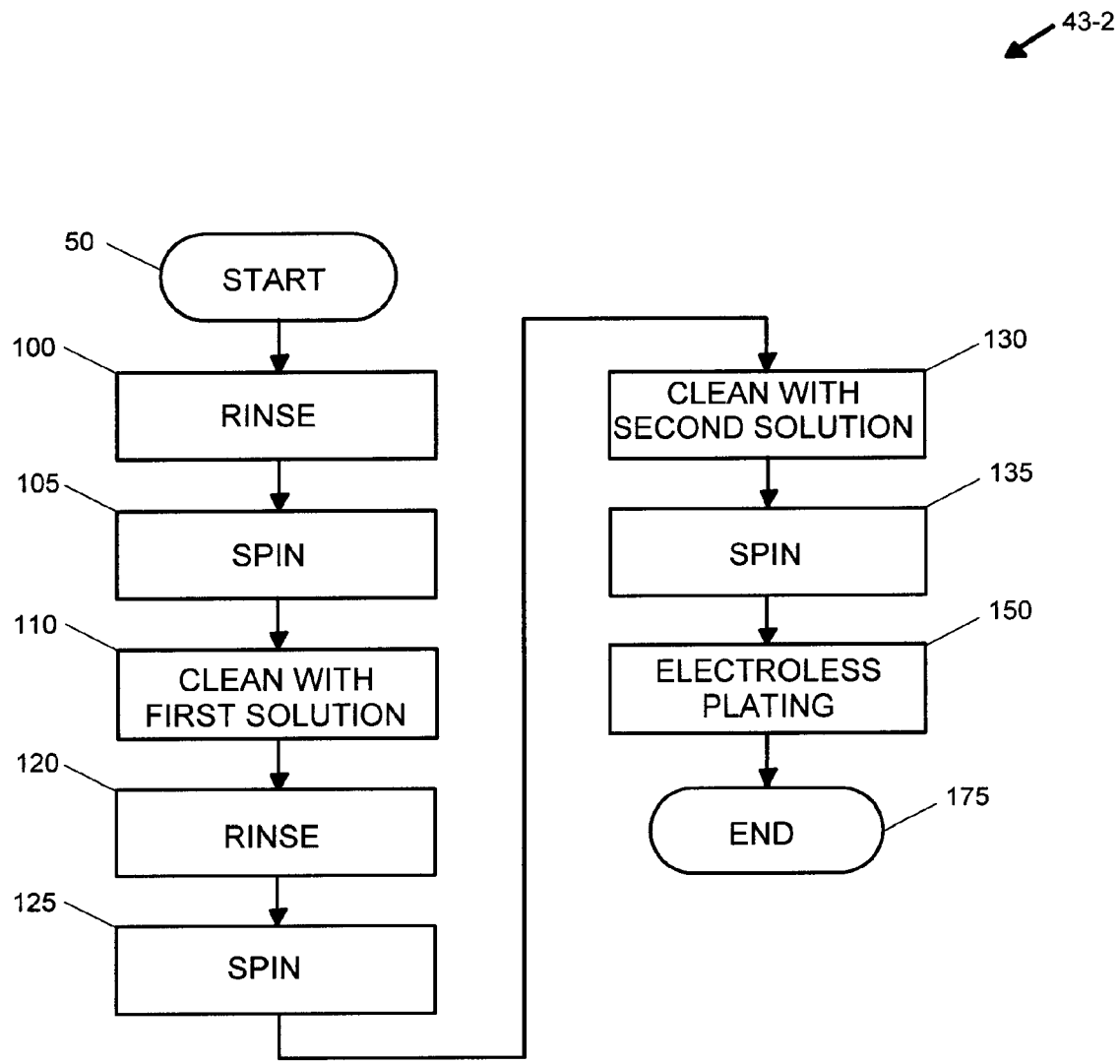
FIG. 14 is a process flow diagram of an embodiment of the present invention.

Reference is now made to FIG. 14 where there is shown a process flow 43-2 according to an embodiment of the present invention. The process flow 43-2 begins with start 50 and includes a rinse 100, a spin 105, a clean with first solution 110, a rinse 120, a spin 125, a clean with second solution 130, a spin 135, an electroless plating 150 and is completed with end 175. For process flow 43-2, the rinse 100, the spin 105, the clean with first solution 110, the rinse 120, the spin 125, the clean with second solution 130, the spin 135, and the electroless plating 150 are essentially the same as described above. Preferred embodiments of process flow 43-2 include using a first cleaning solution such as first cleaning solutions shown in TABLE 3 and a second cleaning solution such as second cleaning solutions shown in TABLE 4. In more preferred embodiments, process flow 43-2 uses a first cleaning solution such as cleaning solutions identified above as (b), (c), (d), (e), (f), (g), (h), (i), (j), (k), and (l) and uses a second cleaning solution such as cleaning solutions identified above as (m) and (n).

Figure 15:
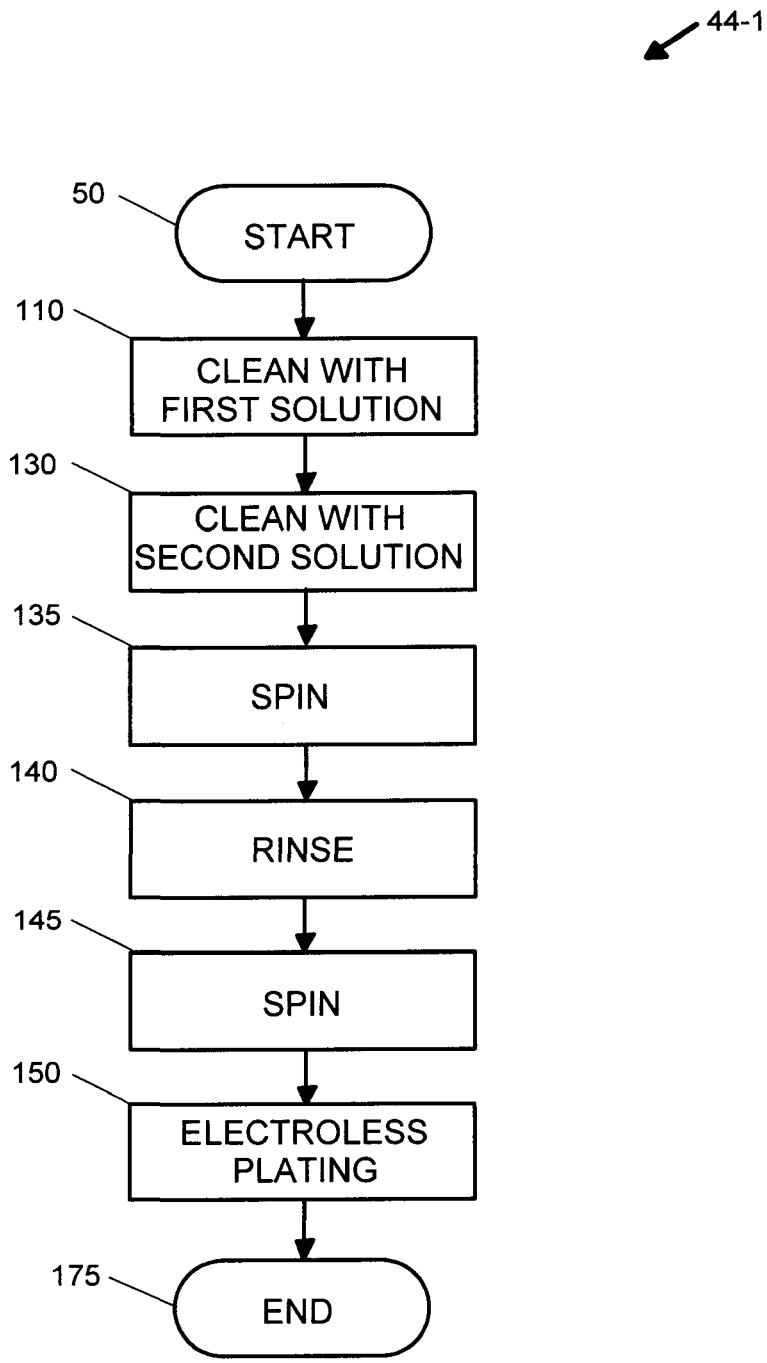
FIG. 15 is a process flow diagram of an embodiment of the present invention.

Reference is now made to FIG. 15 where there is shown a process flow 44-1 according to an embodiment of the present invention. The process flow 44-1 begins with start 50 and includes a clean with first solution 110, a clean with second solution 130, a spin 135, a rinse 140, a spin 145, an electroless plating 150 and is completed with end 175. For process flow 44-1, the clean with first solution 110, the clean with second solution 130, the spin 135, the rinse 140, the spin 145, and the electroless plating 150 are essentially the same as described above. Preferred embodiments of process flow 44-1 include using a first cleaning solution such as first cleaning solutions shown in TABLE 3 and a second cleaning solution such as second cleaning solutions shown in TABLE 4. In more preferred embodiments, process flow 44-1 uses a first cleaning solution such as cleaning solutions identified above as (b), (c), (d), (e), (f), (g), (h), (i), (j), (k), and (l) and uses a second cleaning solution such as cleaning solutions identified above as (b), (c), (d), (g), (h), (i), (j), (k), (l), (m), and (n).

Figure 16:
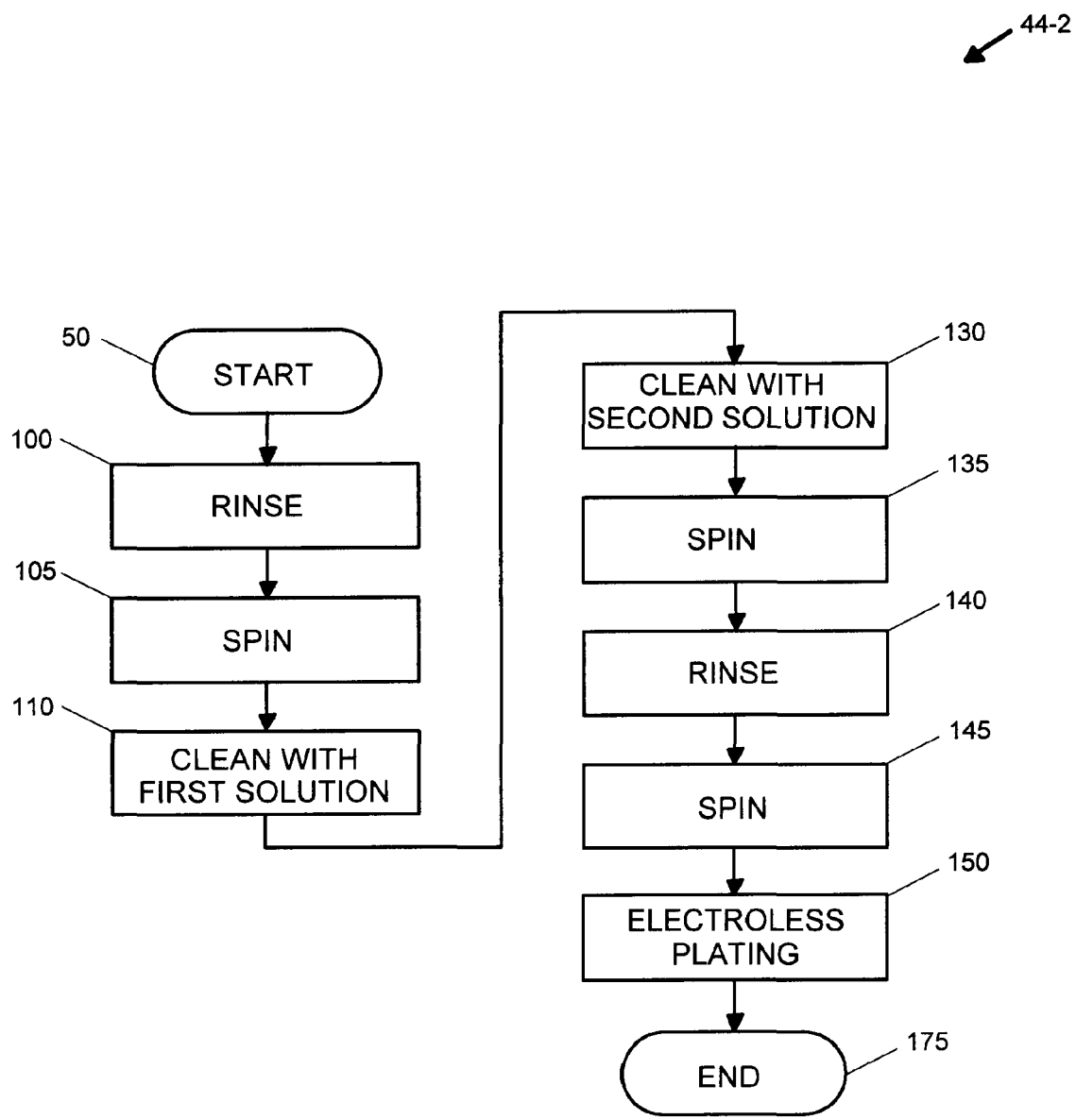
FIG. 16 is a process flow diagram of an embodiment of the present invention.

Reference is now made to FIG. 16 where there is shown a process flow 44-2 according to an embodiment of the present invention. The process flow 44-2 begins with start 50 and includes a rinse 100, a spin 105, a clean with first solution 110, a clean with second solution 130, a spin 135, a rinse 140, a spin 145, an electroless plating 150 and is completed with end 175. For process flow 44-2, the rinse 100, the spin 105, the clean with first solution 110, the clean with second solution 130, the spin 135, the rinse 140, the spin 145, and the electroless plating 150 are essentially the same as described above. Preferred embodiments of process flow 44-2 include using a first cleaning solution such as first cleaning solutions shown in TABLE 3 and a second cleaning solution such as second cleaning solutions shown in TABLE 4. In more preferred embodiments, process flow 44-2 uses a first cleaning solution such as cleaning solutions identified above as (b), (c), (d), (e), (f), (g), (h), (i), (j), (k), and (l) and uses a second cleaning solution such as cleaning solutions identified above as (b), (c), (d), (g), (h), (i), (j), (k), (l), (m), and (n).

Figure 17:
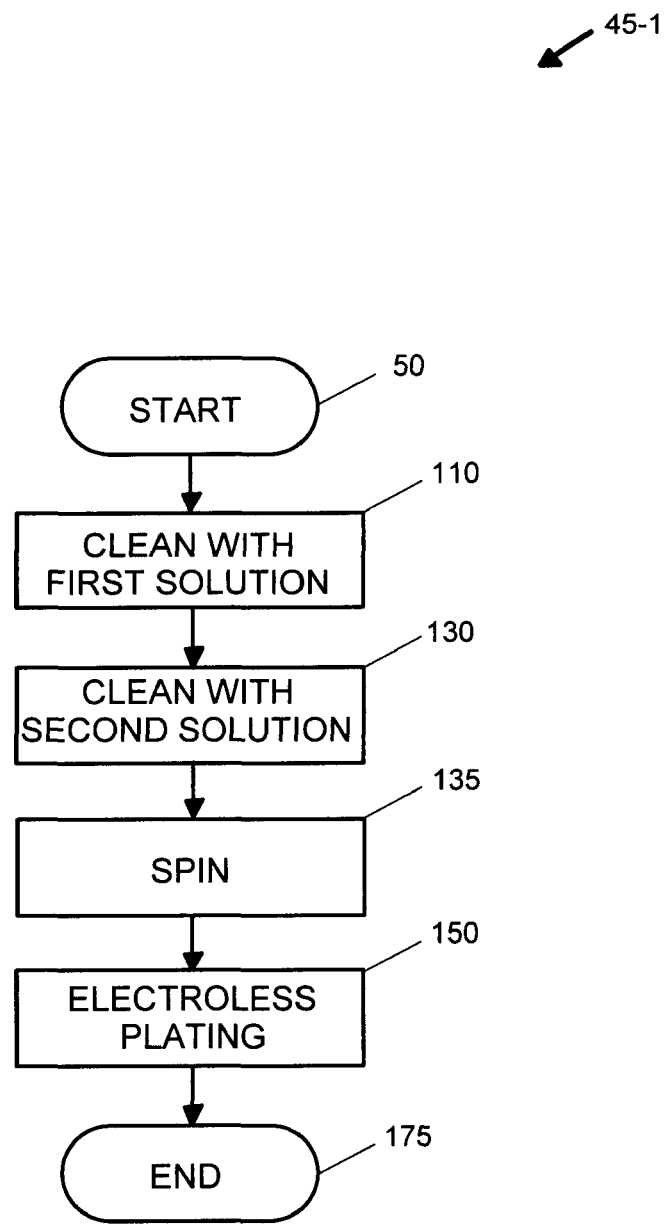
FIG. 17 is a process flow diagram of an embodiment of the present invention.

Reference is now made to FIG. 17 where there is shown a process flow 45-1 according to an embodiment of the present invention. The process flow 45-1 begins with start 50 and includes a clean with first solution 110, a clean with second solution 130, a spin 135, an electroless plating 150 and is completed with end 175. For process flow 45-1, the clean with first solution 110, the clean with second solution 130, the spin 135, and the electroless plating 150 are essentially the same as described above. Preferred embodiments of process flow 45-1 include using a first cleaning solution such as first cleaning solutions shown in TABLE 3 and a second cleaning solution such as second cleaning solutions shown in TABLE 4. In more preferred embodiments, process flow 45-1 uses a first cleaning solution such as cleaning solutions identified above as (b), (c), (d), (e), (f), (g), (h), (i), (j), (k), and (l) and uses a second cleaning solution such as cleaning solutions identified above as (m) and (n).

Figure 18:
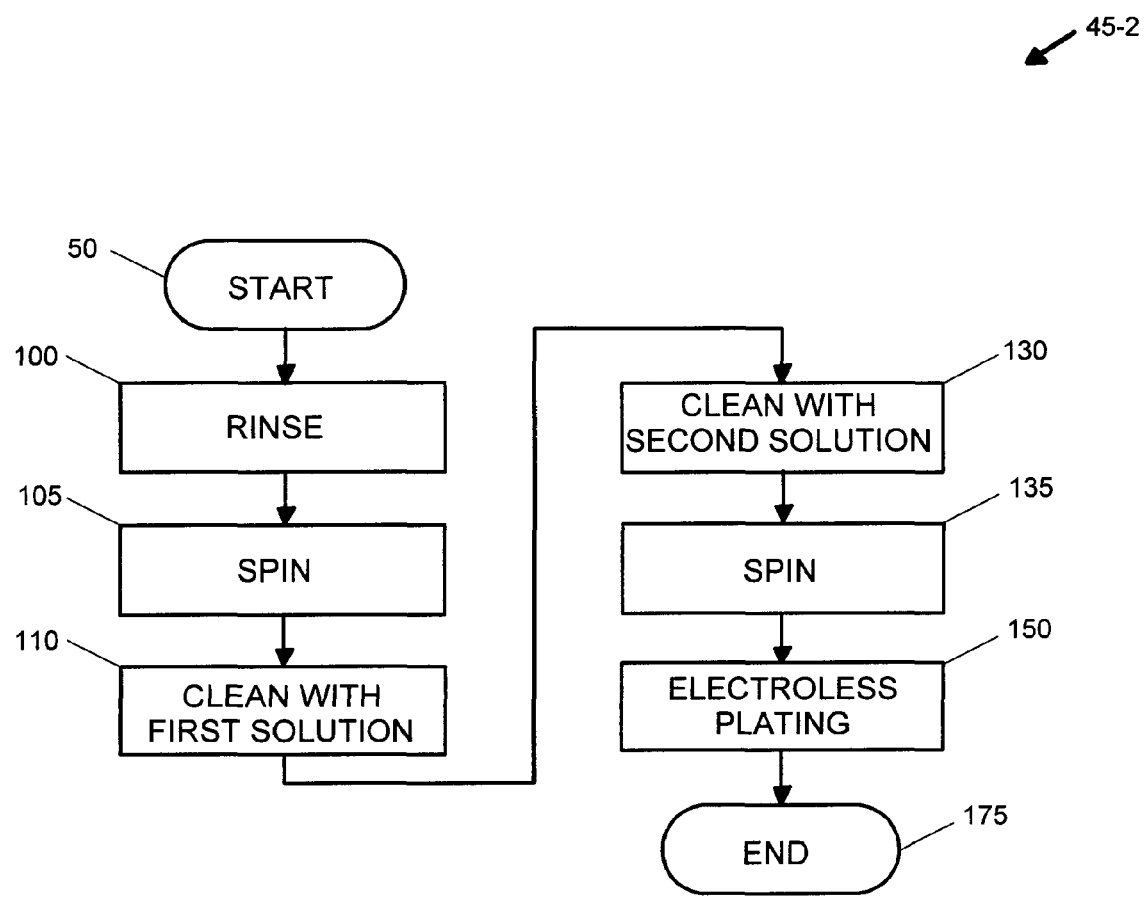
FIG. 18 is a process flow diagram of an embodiment of the present invention.

Reference is now made to FIG. 18 where there is shown a process flow 45-2 according to an embodiment of the present invention. The process flow 45-2 begins with start 50 and includes a rinse 100, a spin 105, a clean with first solution 110, a clean with second solution 130, a spin 135, an electroless plating 150 and is completed with end 175. For process flow 45-2, the rinse 100, the spin 105, the clean with first solution 110, the clean with second solution 130, the spin 135, and the electroless plating 150 are essentially the same as described above. Preferred embodiments of process flow 45-2 include using a first cleaning solution such as first cleaning solutions shown in TABLE 3 and a second cleaning solution such as second cleaning solutions shown in TABLE 4. In more preferred embodiments, process flow 45-2 uses a first cleaning solution such as cleaning solutions identified above as (b), (c), (d), (e), (f), (g), (h), (i), (j, (k), and (l) and uses a second cleaning solution such as cleaning solutions identified above as (m) and (n).

Figure 19:
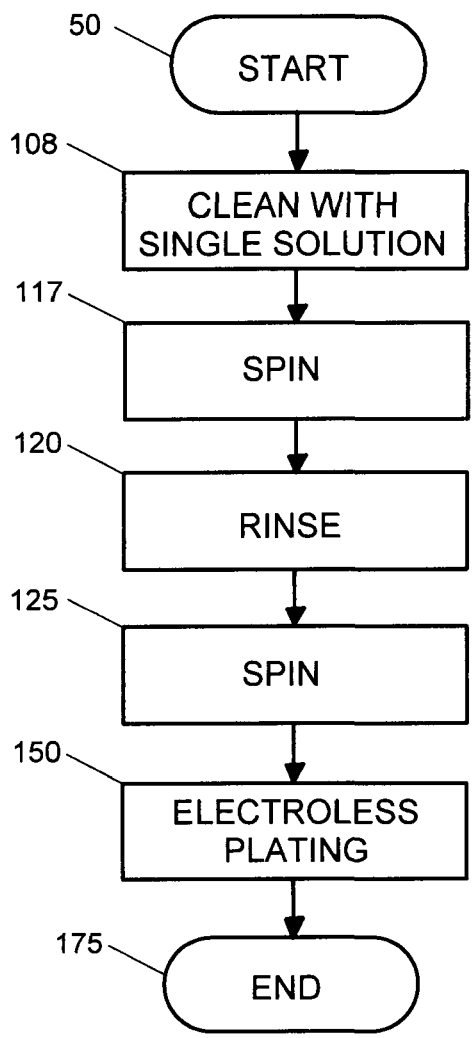
FIG. 19 is a process flow diagram of an embodiment of the present invention.

Reference is now made to FIG. 19 where there is shown a process flow 46-1 according to an embodiment of the present invention. The process flow 46-1 begins with start 50, includes a clean with single solution 108, a spin 117, a rinse 120, a spin 125, an electroless plating 150, and is completed with end 175. For process flow 46-1, the rinse 120, the spin 125, and the electroless plating 150 are essentially the same as described above. The clean with single solution 108 includes exposing a cleaning solution to the surface of the substrate so that the substrate is wetted by the cleaning solution under conditions suitable for cleaning the substrate. The spin 117 includes spinning the substrate so as to remove the cleaning solution, i.e., spinning off excess liquid. For preferred embodiments, spin 117 is done substantially without dewetting or drying the substrate. Preferred embodiments of process flow 46-1 include using a single cleaning solution such as single cleaning solutions shown in TABLE 2. More preferably, process flow 46-1 uses a single cleaning solution such as cleaning solutions identified above as (b), (c), (f), (g), (h), (i), (j), (k), (l), (m), and (n).

Figure 20:
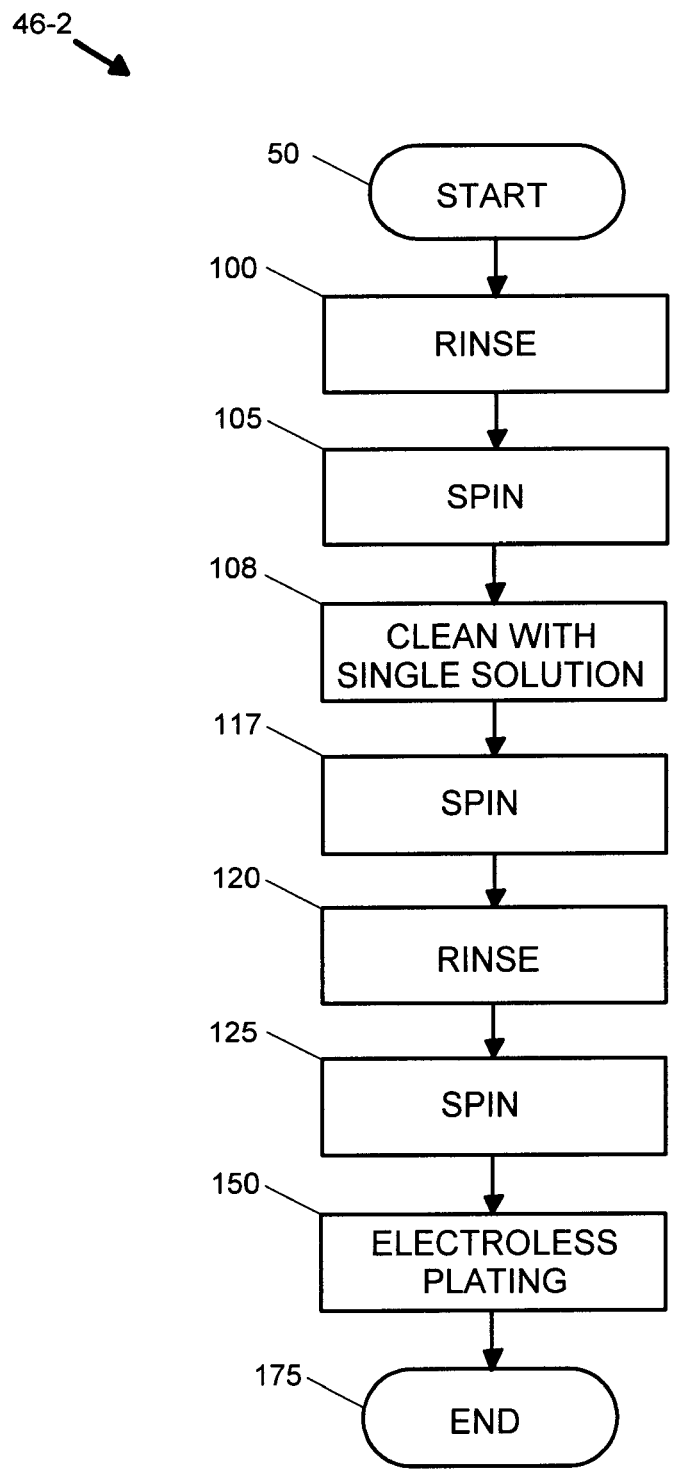
FIG. 20 is a process flow diagram of an embodiment of the present invention.

Reference is now made to FIG. 20 where there is shown a process flow 46-2 according to an embodiment of the present invention. The process flow 46-2 begins with start 50, includes a rinse 100, a spin 105, a clean with single solution 108, a spin 117, a rinse 120, a spin 125, an electroless plating 150, and is completed with end 175. For process flow 46-2, the rinse 100, the spin 105, the clean with single solution 108, the spin 117, the rinse 120, the spin 125, and the electroless plating 150 are essentially the same as described above. Preferred embodiments of process flow 46-2 include using a single cleaning solution such as single cleaning solutions shown in TABLE 2. More preferably, process flow 46-2 uses a single cleaning solution such as cleaning solutions identified above as (b), (c), (f), (g), (h), (i), (j), (k), (l), (m), and (n).

According to preferred embodiments of the present invention the temperature for the substrate cleaning is accomplished using temperatures that are preferably in the range from about 10° C. to about 90° C. Preferably the temperature of the cleaning solution is controlled. As an option, the temperature of the substrate may be controlled.

As presented supra, numerous cleaning solution compositions are suitable for embodiments of the present invention. According to a preferred embodiment of the present invention the cleaning the of substrate is performed using cleaning solution compositions described supra and the concentration of dissolved oxygen in the cleaning solution is maintained at less than about 5 parts per million. This means that for any of the selected cleaning solutions for embodiments of the present invention, it is preferred that the dissolved oxygen concentration in the cleaning solution is maintained at less than about 5 part per million when cleaning the substrate.

According to preferred embodiments, the process flows shown in FIG. 1 through FIG. 20 are conducted with the substrate continuously wetted from start 50 until end 175. In other words, there are no drying or dewetting steps included in the process flows. Such embodiments are particularly beneficial for applications where the substrate cleaning and the electroless deposition occur in the same process chamber. However, the present invention is not limited to such preferred embodiments; other embodiments of the process flows shown in FIG. 1 through FIG. 20 can include one or more drying or dewetting steps. The inclusion of drying or dewetting steps in the process flows shown in FIG. 1 through FIG. 20 can be beneficial for applications where the substrate cleaning occurs in one chamber and the substrate is removed to another chamber for the electroless deposition.

Preferably, the process flows shown in FIG. 1 through FIG. 20 are done in a controlled-ambient environment to limit exposure of the substrate and process liquids to oxygen. Suitable controlled-ambient environments have been described in the patent literature, for example see US 2007/0292603 to Dordi et al., the contents of which are incorporated herein by this reference. As one option, the controlled-ambient environment is an integrated system having at least one process module configured for cleaning the substrate and at least one other process module configured for electroless deposition of the cap layer. The system further includes at least one transfer module coupled to the at least one process module and to the at least one other process module. The at least one transfer module is configured so that the substrate can be transferred between the modules substantially without exposure to an oxide-forming environment. Alternatively, the integrated system may include one process module for both cleaning the substrate and the electroless deposition and at least one transfer module coupled to the process module.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

TABLE 1*

| ID | pH | I | II | III | IV | V | VI | VII | VIII | IX |
|---|---|---|---|---|---|---|---|---|---|---|
| (a) | | P | | | | | | | | |
| (b) | >0.5 and <2.5 | P | P | P | O | | | | | |
| (c) | >2.5 and <5 | P | P | P | O | O | | | | |
| (d) | >5 and <8 | P | P | P | O | O | O | O | | |
| (e) | >8 and <13 | P | P | P | O | O | O | O | | |
| (f) | <2.5 | P | O | O | O | | | | | |
| (g) | >0.5 and <2.5 | P | P | P | O | | | | P | |
| (h) | >2.5 and <5 | P | P | P | O | O | | | P | |
| (i) | >5 and <8 | P | P | P | O | O | O | O | P | |
| (j) | >8 and <13 | P | P | P | O | O | O | O | P | |
| (k) | <2.5 | P | O | O | O | | | | P | |
| (l) | <2.5 | P | O | | O | | | | | P |
| (m) | >1 and <6 | P | P | O | O | | | | | |
| (n) | >1 and <6 | P | O | O | O | | | | | |

*I - Hydroxycarboxylic acid(s) or Non-alkali metal salt(s) of hydroxycarboxylic acid(s)
II - Surfactant(s)
III - Reducing agent(s)
IV - pH adjustor(s)
V - Complexing agent(s) for Cu(I)
VI - Corrosion inhibitor(s)
VII - Oxygen scavenger(s)
VIII - Fluoride compound(s)
IX - Oxidizer(s)
P - Present in the solution
O - Optionally present in the solution

TABLE 2

| | | Single Cleaning Solutions* | | | | | | | | |
|---|---|---|---|---|---|---|---|---|---|---|
| ID | pH | I | II | III | IV | V | VI | VII | VIII | IX |
| (a) | | P | | | | | | | | |
| (b) | >0.5 and <2.5 | P | P | P | O | | | | | |
| (c) | >2.5 and <5 | P | P | P | O | O | | | | |
| (f) | <2.5 | P | O | O | O | | | | | |
| (g) | >0.5 and <2.5 | P | P | P | O | | | | P | |
| (h) | >2.5 and <5 | P | P | P | O | O | | | P | |
| (i) | >5 and <8 | P | P | P | O | O | O | O | P | |
| (j) | >8 and <13 | P | P | P | O | O | O | O | P | |
| (k) | <2.5 | P | O | O | O | | | | P | |
| (l) | <2.5 | P | O | | O | | | | | P |
| (m) | >1 and <6 | P | P | O | O | | | | | |
| (n) | >1 and <6 | P | O | O | O | | | | | |

*I - Hydroxycarboxylic acid(s) or Non-alkali metal salt(s) of hydroxycarboxylic acid(s)
II - Surfactant(s)
III - Reducing agent(s)
IV - pH adjustor(s)
V - Complexing agent(s) for Cu(I)
VI - Corrosion inhibitor(s)
VII - Oxygen scavenger(s)
VIII - Fluoride compound(s)
IX - Oxidizer(s)
P - Present in the solution
O - Optionally present in the solution

TABLE 3

| | | First Cleaning Solutions* | | | | | | | | |
|---|---|---|---|---|---|---|---|---|---|---|
| ID | pH | I | II | III | IV | V | VI | VII | VIII | IX |
| (a) | | P | | | | | | | | |
| (b) | >0.5 and <2.5 | P | P | P | O | | | | | |
| (c) | >2.5 and <5 | P | P | P | O | O | | | | |
| (d) | >5 and <8 | P | P | P | O | O | O | O | | |
| (e) | >8 and <13 | P | P | P | O | O | O | O | | |

TABLE 3-continued

| | | First Cleaning Solutions* | | | | | | | | |
|---|---|---|---|---|---|---|---|---|---|
| ID | pH | I | II | III | IV | V | VI | VII | VIII | IX |
| (f) | <2.5 | P | O | O | O | | | | | |
| (g) | >0.5 and <2.5 | P | P | P | O | | | | P | |
| (h) | >2.5 and <5 | P | P | P | O | O | | | P | |
| (i) | >5 and <8 | P | P | P | O | O | O | O | P | |
| (j) | >8 and <13 | P | P | P | O | O | O | O | P | |
| (k) | <2.5 | P | O | O | O | | | | P | |
| (l) | <2.5 | P | O | | O | | | | | P |

*I - Hydroxycarboxylic acid(s) or Non-alkali metal salt(s) of hydroxycarboxylic acid(s)
II - Surfactant(s)
III - Reducing agent(s)
IV - pH adjustor(s)
V - Complexing agent(s) for Cu(I)
VI - Corrosion inhibitor(s)
VII - Oxygen scavenger(s)
VIII - Fluoride compound(s)
IX - Oxidizer(s)
P - Present in the solution
O - Optionally present in the solution

TABLE 4

| | | Second Cleaning Solutions* | | | | | | | | |
|---|---|---|---|---|---|---|---|---|---|
| ID | pH | I | II | III | IV | V | VI | VII | VIII | IX |
| (a) | | P | | | | | | | | |
| (b) | >0.5 and <2.5 | P | P | P | O | | | | | |
| (c) | >2.5 and <5 | P | P | P | O | O | | | | |
| (d) | >5 and <8 | P | P | P | O | O | O | O | | |
| (g) | >0.5 and <2.5 | P | P | P | O | | | | P | |
| (h) | >2.5 and <5 | P | P | P | O | O | | | P | |
| (i) | >5 and <8 | P | P | P | O | O | O | O | P | |
| (j) | >8 and <13 | P | P | P | O | O | O | O | P | |
| (k) | <2.5 | P | O | O | O | | | | P | |
| (m) | >1 and <6 | P | P | O | O | | | | | |
| (n) | >1 and <6 | P | O | O | O | | | | | |

*I - Hydroxycarboxylic acid(s) or Non-alkali metal salt(s) of hydroxycarboxylic acid(s)
II - Surfactant(s)
III - Reducing agent(s)
IV - pH adjustor(s)
V - Complexing agent(s) for Cu(I)
VI - Corrosion inhibitor(s)
VII - Oxygen scavenger(s)
VIII - Fluoride compound(s)
IX - Oxidizer(s)
P - Present in the solution
O - Optionally present in the solution

What is claimed is:

1. A method of depositing a cap layer on a substrate surface, comprising:
    (A) exposing the substrate surface to a first cleaning solution;
    after exposing the substrate surface to a first cleaning solution, spinning off the first cleaning solution without drying or dewetting the substrate surface, rinsing the substrate with deionized water, and spinning off excess liquid from the substrate without drying or dewetting the substrate surface;
    (B) after spinning off excess liquid from the substrate without drying or dewetting the substrate surface, exposing the substrate surface to a second cleaning solution;
    after exposing the substrate surface to a second cleaning solution, spinning off the second cleaning solution without drying or dewetting the substrate surface, rinsing the substrate with deionized water, and spinning off excess liquid from the substrate without drying or dewetting the substrate surface; and
    (C) after spinning off excess liquid from the substrate without drying or dewetting the substrate surface, depositing the cap layer on the substrate surface with an electroless deposition solution;
    wherein the substrate surface is not dried or dewetted from (A) through (C).

2. The method of claim 1, further comprising:
    wherein at least the second cleaning solution comprises only components that substantially do not obstruct the performance of the electroless deposition solution if present therein, and
    wherein the substrate is not dried or dewetted until after depositing the cap layer.

3. The method of claim 2, further comprising:
    one or more act(s) to rinse the substrate with deionized water or with deionized water having one or more surfactant(s).

4. The method of claim 2, further comprising:
    rinsing the substrate with deionized water or with deionized water having one or more surfactant(s); and
    spinning the substrate to remove the deionized water substantially without dewetting or drying the surface of the substrate.

5. The method of claim 1, wherein the first cleaning solution comprises one or more hydroxycarboxylic acid(s) or one or more non-alkali metal salt(s) of one or more hydroxycarboxylic acid(s).

6. The method of claim 1, wherein the second cleaning solution comprises one or more hydroxycarboxylic acid(s) or one or more non-alkali metal salt(s) of one or more hydroxycarboxylic acid(s).

7. The method of claim 2, wherein
    the second cleaning solution comprises one or more hydroxycarboxylic acid(s) or one or more non-alkali metal salt(s) of one or more hydroxycarboxylic acid(s); and
    the electroless deposition solution comprises the one or more hydroxycarboxylic acid(s) or the one or more non-alkali metal salt(s) of the one or more hydroxycarboxylic acid(s).

8. The method of claim 2, wherein the first cleaning solution comprises one or more hydroxycarboxylic acid(s) or one or more non-alkali metal salt(s) of one or more hydroxycarboxylic acid(s); and the electroless deposition solution comprises the one or more hydroxycarboxylic acid(s) or the one or more non-alkali metal salt(s) of the one or more hydroxycarboxylic acid(s).

9. The method of claim 1, wherein
    the first cleaning solution comprises:
        one or more hydroxycarboxylic acid(s) or one or more non-alkali metal salt(s) of one or more hydroxycarboxylic acid(s);
        one or more surfactant(s);
        one or more reducing agent(s); and
        optionally, one or more pH adjustor(s);
    the pH of the first cleaning solution is >0.5 and <2.5.

10. The method of claim 1, wherein
    the first cleaning solution comprises:
        one or more hydroxycarboxylic acid(s) or one or more non-alkali metal salt(s) of one or more hydroxycarboxylic acid(s);
        one or more surfactant(s);
        one or more reducing agent(s);
        optionally, one or more pH adjustor(s); and
        optionally, one or more complexing agent(s) for Cu(I) ions;
    the pH of the first cleaning solution is >2.5 and <5.

11. The method of claim 1, wherein
the first cleaning solution comprises:
- one or more hydroxycarboxylic acid(s) or one or more non-alkali metal salt(s) of one or more hydroxycarboxylic acid(s);
- one or more surfactant(s);
- one or more reducing agent(s);
- optionally, one or more pH adjustor(s);
- optionally, one or more complexing agent(s) for Cu(I) ions;
- optionally, one or more corrosion inhibitor(s) substantially free of nitrogen and substantially free of sulfur; and
- optionally, one or more oxygen scavenger(s);

the pH of the first cleaning solution is >5 and <8.

12. The method of claim 1, wherein
the first cleaning solution comprises:
- one or more hydroxycarboxylic acid(s) or one or more non-alkali metal salt(s) of one or more hydroxycarboxylic acid(s);
- one or more surfactant(s);
- one or more reducing agent(s);
- optionally, one or more pH adjustor(s);
- optionally, one or more complexing agent(s) for Cu(I) ions;
- optionally, one or more corrosion inhibitor(s) substantially free of nitrogen and substantially free of sulfur; and
- optionally, one or more oxygen scavenger(s);

the pH of the cleaning solution is >8 and <13.

13. The method of claim 1, wherein
the first cleaning solution comprises:
- one or more hydroxycarboxylic acid(s) or one or more non-alkali metal salt(s) of one or more hydroxycarboxylic acid(s);
- optionally, one or more surfactant(s);
- optionally, one or more reducing agent(s); and
- optionally, one or more pH adjustor(s);

the pH of the first cleaning solution is <2.5.

14. The method of claim 1, wherein
the first cleaning solution comprises:
- one or more hydroxycarboxylic acid(s) or one or more non-alkali metal salt(s) of one or more hydroxycarboxylic acid(s);
- one or more surfactant(s);
- one or more reducing agent(s);
- optionally, one or more pH adjustor(s); and
- one or more fluoride compound(s) selected from the group consisting of hydrogen fluoride, tetrafluoroborate, and non-metal salts of hydrofluoric acid;

the pH of the first cleaning solution is >0.5 and <2.5.

15. The method of claim 1, wherein
the first cleaning solution comprises:
- one or more hydroxycarboxylic acid(s) or one or more non-alkali metal salt(s) of one or more hydroxycarboxylic acid(s);
- one or more surfactant(s);
- one or more reducing agent(s);
- optionally, one or more pH adjustor(s);
- optionally, one or more complexing agent(s) for Cu(I) ions; and
- one or more fluoride compound(s) selected from the group consisting of hydrogen fluoride, tetrafluoroborate, and non-metal salts of hydrofluoric acid;

the pH of the first cleaning solution is >2.5 and <5.

16. The method of claim 1, wherein
the first cleaning solution comprises:
- one or more hydroxycarboxylic acid(s) or one or more non-alkali metal salt(s) of one or more hydroxycarboxylic acid(s);
- one or more surfactant(s);
- one or more reducing agent(s);
- optionally, one or more pH adjustor(s);
- optionally, one or more complexing agent(s) for Cu(I) ions;
- optionally, one or more corrosion inhibitor(s) substantially free of nitrogen and substantially free of sulfur;
- optionally, one or more oxygen scavenger(s); and
- one or more fluoride compound(s) selected from the group consisting of hydrogen fluoride, tetrafluoroborate, and non-metal salts of hydrofluoric acid;

the pH of the first cleaning solution is >5 and <8.

17. The method of claim 1,
the first cleaning solution comprises:
- one or more hydroxycarboxylic acid(s) or one or more non-alkali metal salt(s) of one or more hydroxycarboxylic acid(s);
- one or more surfactant(s);
- one or more reducing agent(s);
- optionally, one or more pH adjustor(s);
- optionally, one or more complexing agent(s) for Cu(I) ions;
- optionally, one or more corrosion inhibitor(s) substantially free of nitrogen and substantially free of sulfur;
- optionally, one or more oxygen scavenger(s); and
- one or more fluoride compound(s) selected from the group consisting of hydrogen fluoride, tetrafluoroborate, and non-metal salts of hydrofluoric acid;

the pH of the first cleaning solution is >8 and <13.

18. The method of claim 1,
the first cleaning solution comprises:
- one or more hydroxycarboxylic acid(s) or one or more non-alkali metal salt(s) of one or more hydroxycarboxylic acid(s);
- optionally, one or more surfactant(s);
- optionally, one or more reducing agent(s);
- optionally, one or more pH adjustor(s); and
- one or more fluoride compound(s) selected from the group consisting of hydrogen fluoride, tetrafluoroborate, and non-metal salts of hydrofluoric acid;

the pH of the first cleaning solution is <2.5.

19. The method of claim 1,
the first cleaning solution comprises:
- one or more hydroxycarboxylic acid(s) or one or more non-alkali metal salt(s) of one or more hydroxycarboxylic acid(s);
- one or more oxidizer(s);
- optionally, one or more surfactant(s);
- optionally, one or more pH adjustor(s); and the pH of the first cleaning solution is <2.5.

20. The method of claim 1, wherein
the second cleaning solution comprises:
- one or more hydroxycarboxylic acid(s) or one or more non-alkali metal salt(s) of one or more hydroxycarboxylic acid(s);
- one or more surfactant(s);
- one or more reducing agent(s); and
- optionally, one or more pH adjustor(s);

the pH of the second cleaning solution is >0.5 and <2.5.

21. The method of claim 1, wherein
the second cleaning solution comprises:
  one or more hydroxycarboxylic acid(s) or one or more non-alkali metal salt(s) of one or more hydroxycarboxylic acid(s);
  one or more surfactant(s);
  one or more reducing agent(s);
  optionally, one or more pH adjustor(s); and
  optionally, one or more complexing agent(s) for Cu(I) ions;
the pH of the second cleaning solution is >2.5 and <5.

22. The method of claim 1, wherein
the second cleaning solution comprises:
  one or more hydroxycarboxylic acid(s) or one or more non-alkali metal salt(s) of one or more hydroxycarboxylic acid(s);
  one or more surfactant(s);
  one or more reducing agent(s);
  optionally, one or more pH adjustor(s);
  optionally, one or more complexing agent(s) for Cu(I) ions;
  optionally, one or more corrosion inhibitor(s) substantially free of nitrogen and substantially free of sulfur; and
  optionally, one or more oxygen scavenger(s);
the pH of the second cleaning solution is >5 and <8.

23. The method of claim 1, wherein
the second cleaning solution comprises:
  one or more hydroxycarboxylic acid(s) or one or more non-alkali metal salt(s) of one or more hydroxycarboxylic acid(s);
  one or more surfactant(s);
  one or more reducing agent(s);
  optionally, one or more pH adjustor(s); and
  one or more fluoride compound(s) selected from the group consisting of hydrogen fluoride, tetrafluoroborate, and non-metal salts of hydrofluoric acid;
the pH of the second cleaning solution is >0.5 and <2.5.

24. The method of claim 1, wherein
the second cleaning solution comprises:
  one or more hydroxycarboxylic acid(s) or one or more non-alkali metal salt(s) of one or more hydroxycarboxylic acid(s);
  one or more surfactant(s);
  one or more reducing agent(s);
  optionally, one or more pH adjustor(s);
  optionally, one or more complexing agent(s) for Cu(I) ions; and
  one or more fluoride compound(s) selected from the group consisting of hydrogen fluoride, tetrafluoroborate, and non-metal salts of hydrofluoric acid;
the pH of the second cleaning solution is >2.5 and <5.

25. The method of claim 1, wherein
the second cleaning solution comprises:
  one or more hydroxycarboxylic acid(s) or one or more non-alkali metal salt(s) of one or more hydroxycarboxylic acid(s);
  one or more surfactant(s);
  one or more reducing agent(s);
  optionally, one or more pH adjustor(s);
  optionally, one or more complexing agent(s) for Cu(I) ions;
  optionally, one or more corrosion inhibitor(s) substantially free of nitrogen and substantially free of sulfur;
  optionally, one or more oxygen scavenger(s); and
  one or more fluoride compound(s) selected from the group consisting of hydrogen fluoride, tetrafluoroborate, and non-metal salts of hydrofluoric acid;
the pH of the second cleaning solution is >5 and <8.

26. The method of claim 1, wherein
the second cleaning solution comprises:
  one or more hydroxycarboxylic acid(s) or one or more non-alkali metal salt(s) of one or more hydroxycarboxylic acid(s);
  one or more surfactant(s);
  one or more reducing agent(s);
  optionally, one or more pH adjustor(s);
  optionally, one or more complexing agent(s) for Cu(I) ions;
  optionally, one or more corrosion inhibitor(s) substantially free of nitrogen and substantially free of sulfur;
  optionally, one or more oxygen scavenger(s); and
  one or more fluoride compound(s) selected from the group consisting of hydrogen fluoride, tetrafluoroborate, and non-metal salts of hydrofluoric acid;
the pH of the second cleaning solution is >8 and <13.

27. The method of claim 1, wherein
the second cleaning solution comprises:
  one or more hydroxycarboxylic acid(s) or one or more non-alkali metal salt(s) of one or more hydroxycarboxylic acid(s);
  optionally, one or more surfactant(s);
  optionally, one or more reducing agent(s);
  optionally, one or more pH adjustor(s); and
  one or more fluoride compound(s) selected from the group consisting of hydrogen fluoride, tetrafluoroborate, and non-metal salts of hydrofluoric acid;
the pH of the second cleaning solution is <2.5.

28. The method of claim 1, wherein
the second cleaning solution comprises:
  one or more hydroxycarboxylic acid(s) or one or more non-alkali metal salt(s) of one or more hydroxycarboxylic acid(s);
  one or more surfactant(s);
  optionally, one or more reducing agent(s); and
  optionally, one or more pH adjustor(s);
the electroless deposition solution comprises:
  the one or more hydroxycarboxylic acid(s) or the one or more non-alkali metal salt(s) of the one or more hydroxycarboxylic acid(s);
  the one or more surfactant(s);
  optionally, the one or more reducing agent(s); and
  optionally, the one or more pH adjustor(s);
the pH of the second cleaning solution is >1 and <6.

29. The method of claim 1, wherein
the second cleaning solution comprises:
  one or more hydroxycarboxylic acid(s) or one or more non-alkali metal salt(s) of one or more hydroxycarboxylic acid(s);
  optionally, one or more surfactant(s);
  optionally, one or more reducing agent(s); and
  optionally, one or more pH adjustor(s);
the electroless deposition solution comprises:
  the one or more hydroxycarboxylic acid(s) or the one or more non-alkali metal salt(s) of the one or more hydroxycarboxylic acid(s);
  one or more surfactant(s);
  optionally, the one or more reducing agent(s); and
  optionally, the one or more pH adjustor(s);
the pH of the second cleaning solution is >1 and <6.

30. The method of claim 1, further comprising:
wetting the substrate with deionized water and spinning off excess liquid from the substrate without drying or dewetting the substrate surface before exposing the substrate surface to the first cleaning solution.

31. The method of claim 1, further comprising:
before (A), rinsing the substrate with deionized water and spinning off excess liquid from the substrate without drying or dewetting the substrate surface.

32. A method of claim 1, further comprising:
wherein at least the second cleaning solution comprises only components that substantially do not obstruct the performance of the electroless deposition solution if present therein;
wherein the cleaning solution is substantially free of sulfur; and
wherein the substrate is not dried or dewetted until after depositing the cap layer.

33. The method of claim 32, further comprising:
one or more act(s) to rinse the substrate with deionized water or with deionized water having one or more surfactant(s).

34. The method of claim 32, further comprising:
rinsing the substrate with deionized water or with deionized water having one or more surfactant(s); and
spinning the substrate to remove the deionized water substantially without dewetting or drying the surface of the substrate.

35. The method of claim 32, wherein the first cleaning solution comprises one or more hydroxycarboxylic acid(s) or one or more non-alkali metal salt(s) of one or more hydroxycarboxylic acid(s).

36. The method of claim 32, wherein the second cleaning solution comprises one or more hydroxycarboxylic acid(s) or one or more non-alkali metal salt(s) of one or more hydroxycarboxylic acid(s).

* * * * *